(12) United States Patent
Leem

(10) Patent No.: US 11,532,423 B2
(45) Date of Patent: Dec. 20, 2022

(54) COIL DEVICE

(71) Applicant: LG INNOTEK CO., LTD., Seoul (KR)

(72) Inventor: Sung Hyun Leem, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 492 days.

(21) Appl. No.: 16/491,443

(22) PCT Filed: Mar. 5, 2018

(86) PCT No.: PCT/KR2018/002579
§ 371 (c)(1),
(2) Date: Sep. 5, 2019

(87) PCT Pub. No.: WO2018/164430
PCT Pub. Date: Sep. 13, 2018

(65) Prior Publication Data
US 2020/0035399 A1   Jan. 30, 2020

(30) Foreign Application Priority Data

Mar. 6, 2017 (KR) .......................... 10-2017-0028275
Mar. 6, 2017 (KR) .......................... 10-2017-0028283

(51) Int. Cl.
*H01F 27/28* (2006.01)
*H01F 27/06* (2006.01)
(Continued)

(52) U.S. Cl.
CPC ............. *H01F 27/28* (2013.01); *H01F 27/06* (2013.01); *H01F 27/08* (2013.01); *H01F 27/2885* (2013.01); *H01F 27/36* (2013.01)

(58) Field of Classification Search
CPC .......... H01F 27/28; H01F 27/06; H01F 27/08; H01F 27/2885; H01F 27/36;
(Continued)

(56) References Cited

U.S. PATENT DOCUMENTS 9,906,274 B2    2/2018  Jung et al.
2006/0267853 A1 11/2006 Naito
(Continued)

FOREIGN PATENT DOCUMENTS

JP    2012-124217 A    6/2012
KR    10-2006-0125540 A  12/2006
(Continued)

OTHER PUBLICATIONS

International Search Report issued in PCT/KR2018/002579 (PCT/ISA/210), dated Jun. 28, 2018.

*Primary Examiner* — Tuyen T Nguyen
(74) *Attorney, Agent, or Firm* — Birch, Stewart, Kolasch & Birch, LLP

(57) ABSTRACT

The present embodiment relates to a coil device.
The coil device according to the present embodiment includes: first to third coils including a connecting portion; and a coil frame including an upper receiving portion for housing the first coil, a lower receiving portion for housing the second and third coils, and a cable fixing portion for fixing each connecting portion of the first to third coils.

20 Claims, 13 Drawing Sheets

(51) Int. Cl.
*H01F 27/08* (2006.01)
*H01F 27/36* (2006.01)

(58) Field of Classification Search
CPC ............. H01F 2027/297; H01F 27/025; H01F 27/2871; H01F 27/22; H01F 27/29; H01F 38/14; H01B 7/40; H01L 27/30; H02J 50/12
See application file for complete search history.

(56) References Cited

U.S. PATENT DOCUMENTS

| | | |
|---|---|---|
| 2009/0021212 A1* | 1/2009 | Hasegawa ........... H01F 27/2885 320/108 |
| 2013/0015718 A1 | 1/2013 | Jung et al. |
| 2013/0069586 A1 | 3/2013 | Jung et al. |
| 2015/0288196 A1 | 10/2015 | Park et al. |
| 2017/0178804 A1 | 6/2017 | Leem |
| 2018/0198186 A1 | 7/2018 | Hwang |
| 2018/0198310 A1* | 7/2018 | Hwang ................. H02J 7/0042 |

FOREIGN PATENT DOCUMENTS

| | | |
|---|---|---|
| KR | 10-1213090 B1 | 12/2012 |
| KR | 10-1246692 B1 | 3/2013 |
| KR | 10-2014-0019955 A | 2/2014 |
| KR | 10-1559939 B1 | 10/2015 |
| KR | 10-1690500 B1 | 12/2016 |
| KR | 10-2017-0010736 A | 2/2017 |
| KR | 10-1804410 B1 | 12/2017 |

\* cited by examiner

【FIG. 1】
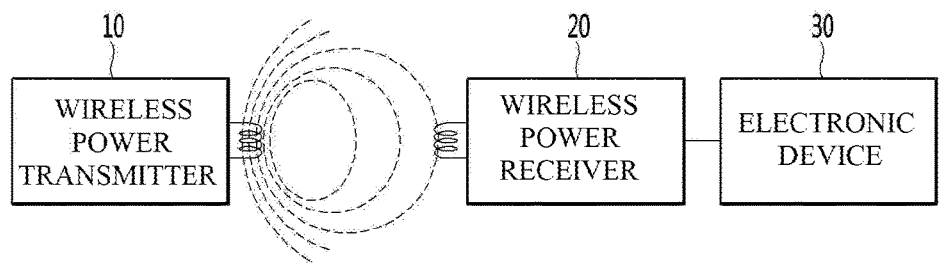
【FIG. 2】
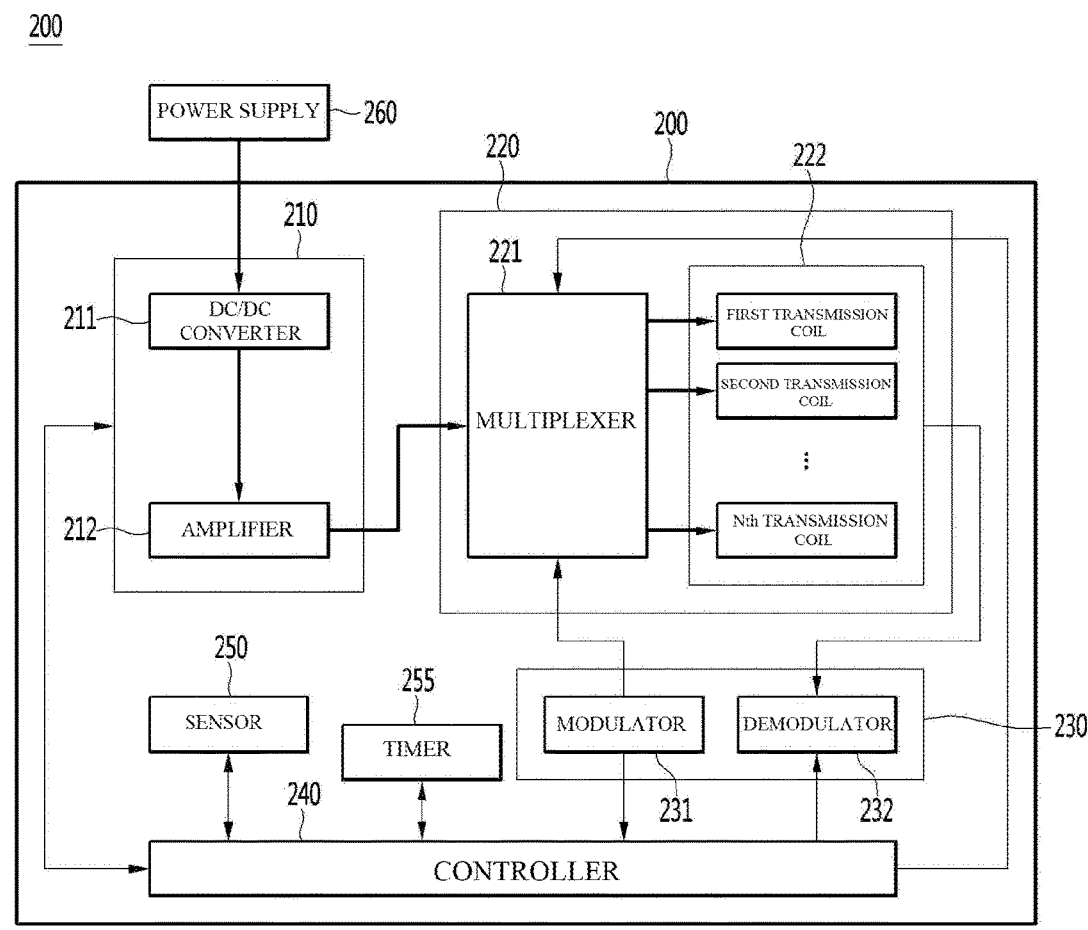

【FIG. 3】
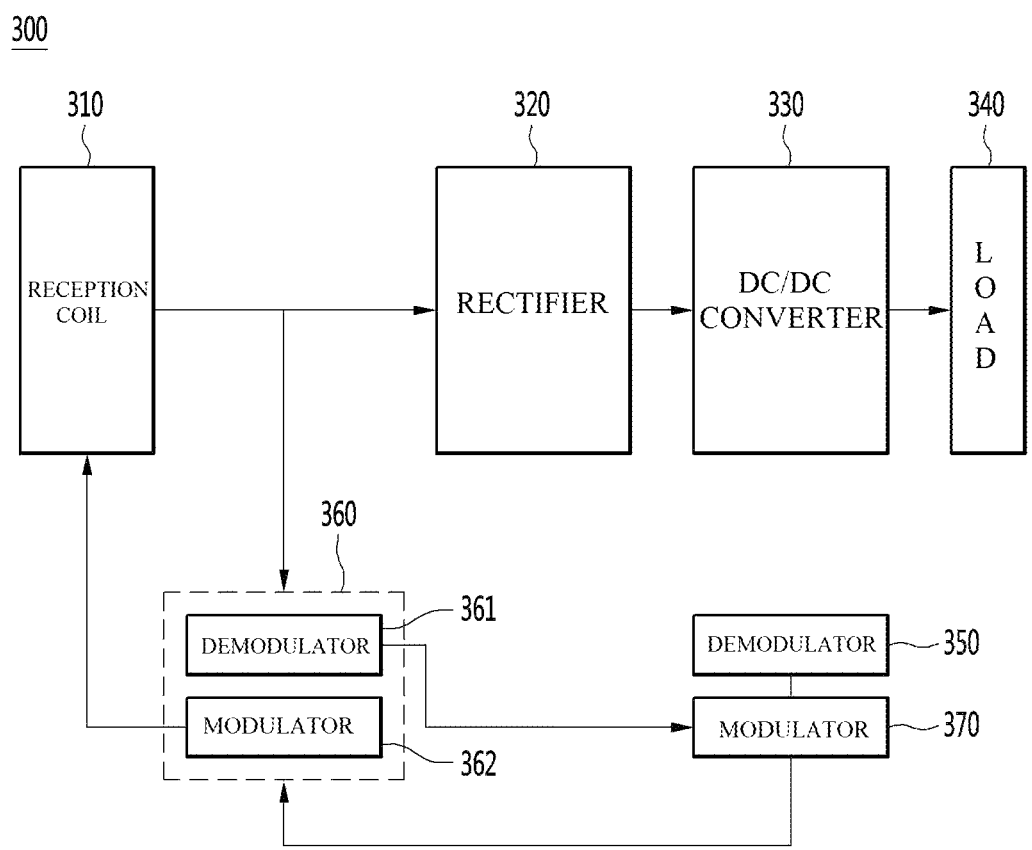

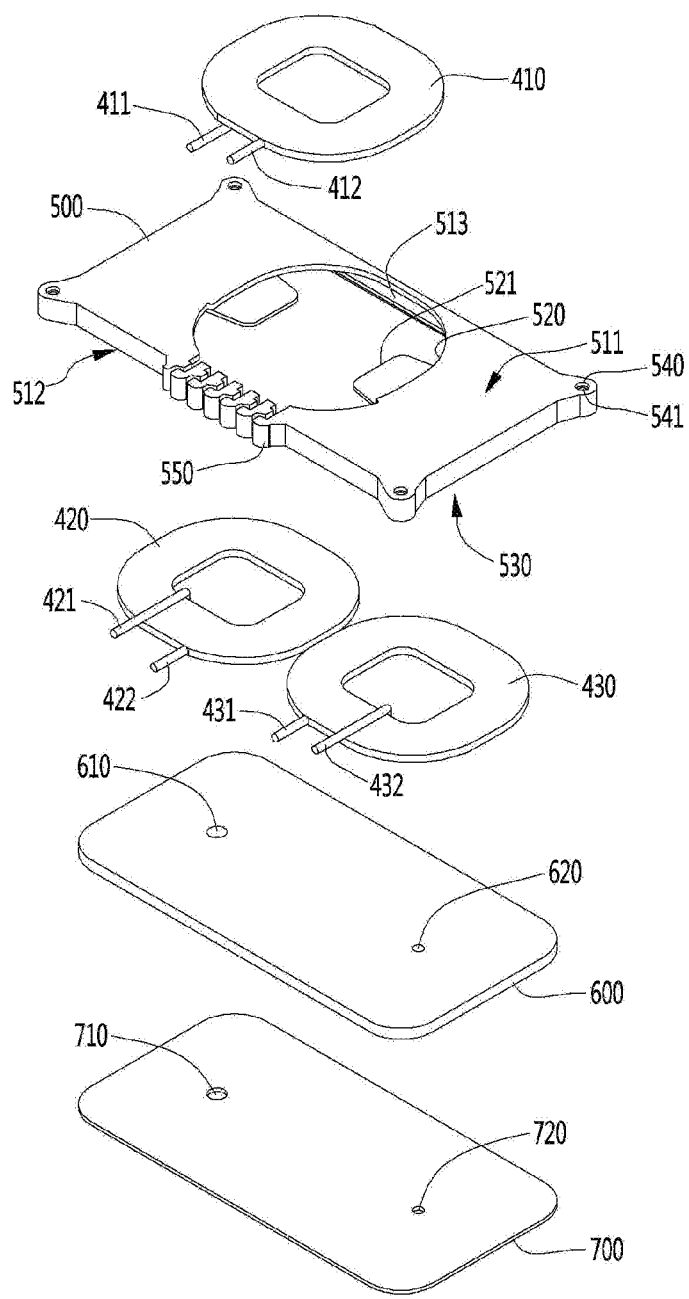
[FIG. 4]

[FIG. 5]
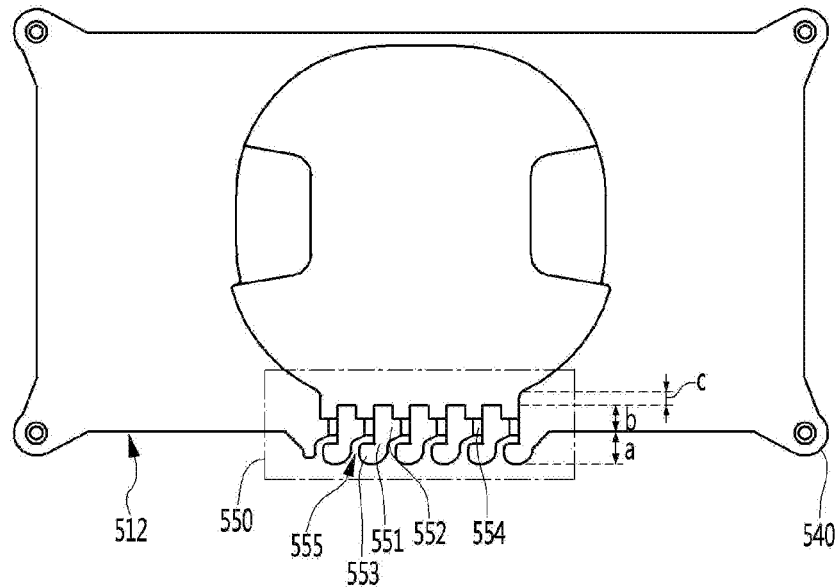
[FIG. 6]
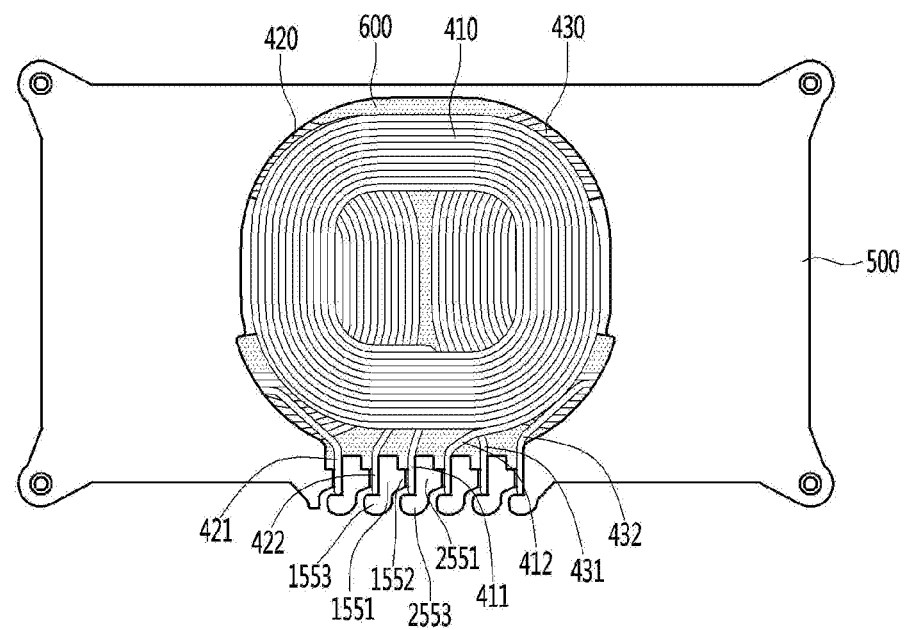

【FIG. 7】
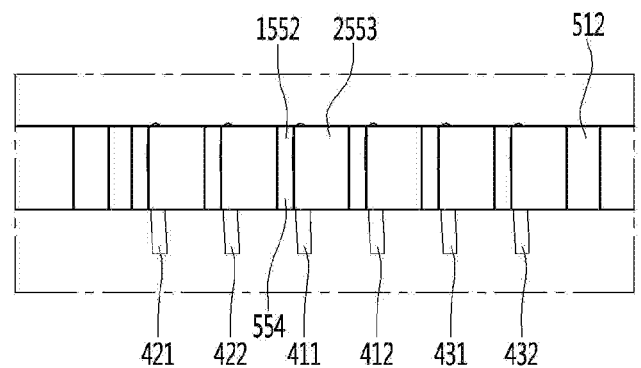
【FIG. 8】
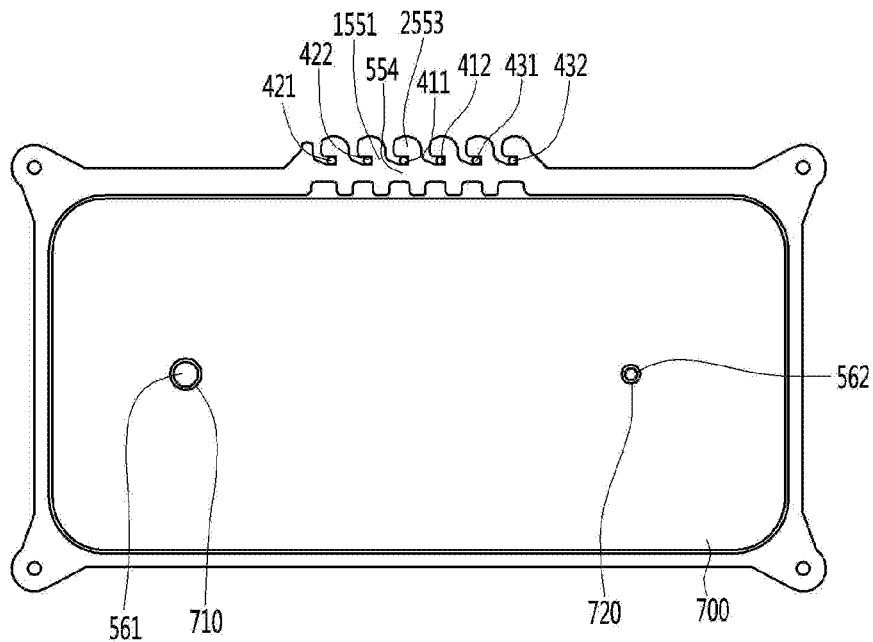

[FIG. 9]
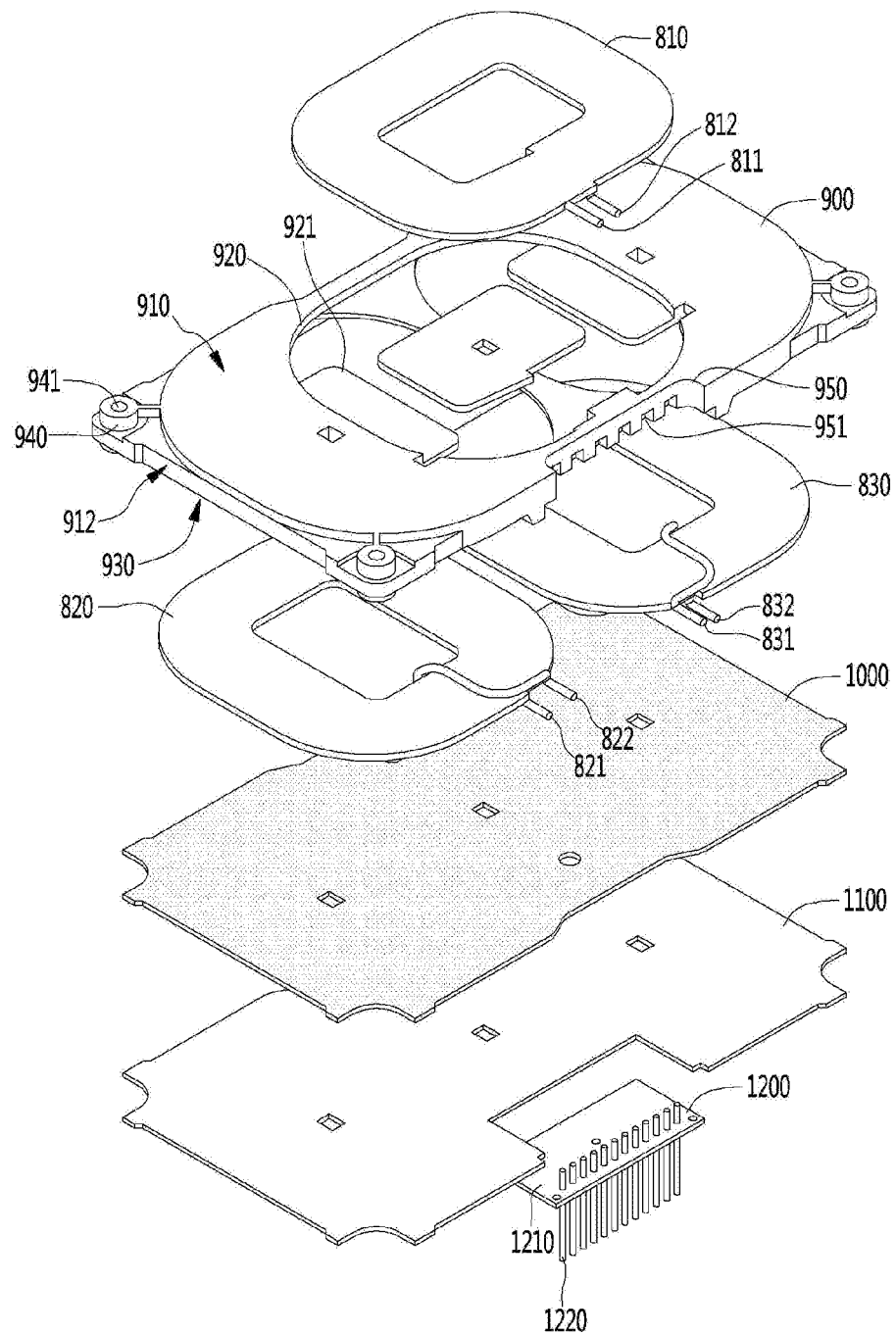

[FIG. 10]
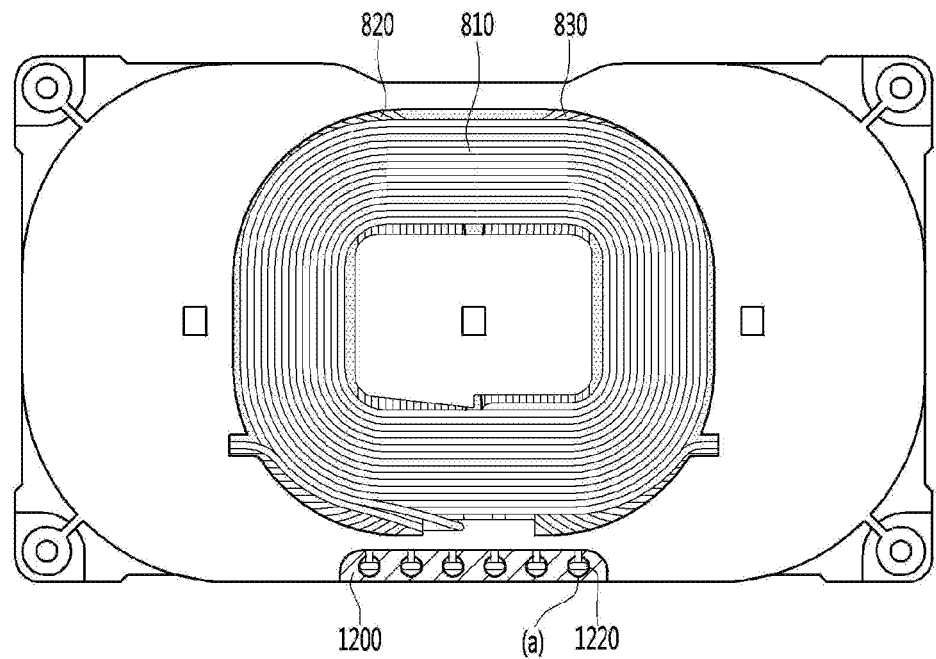
[FIG. 11]
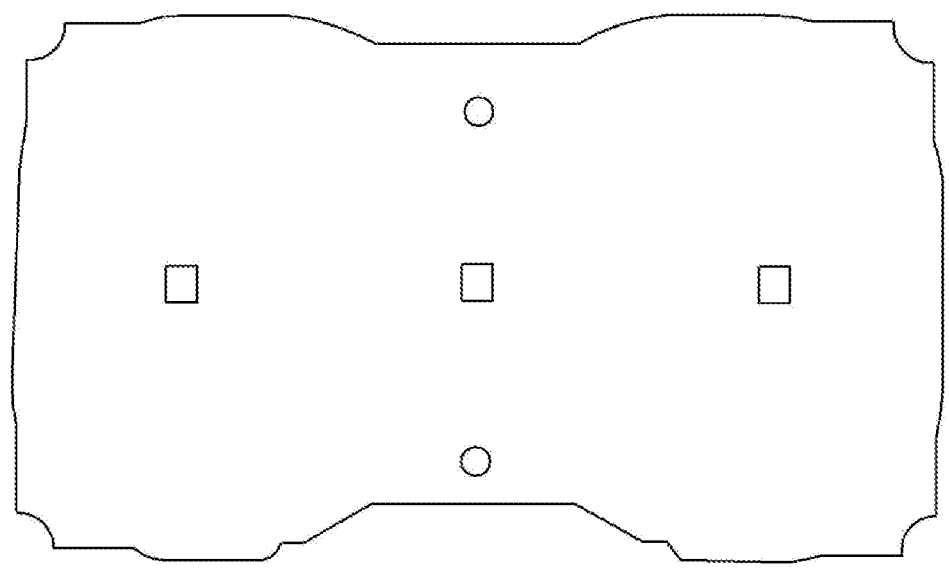

[FIG. 12]
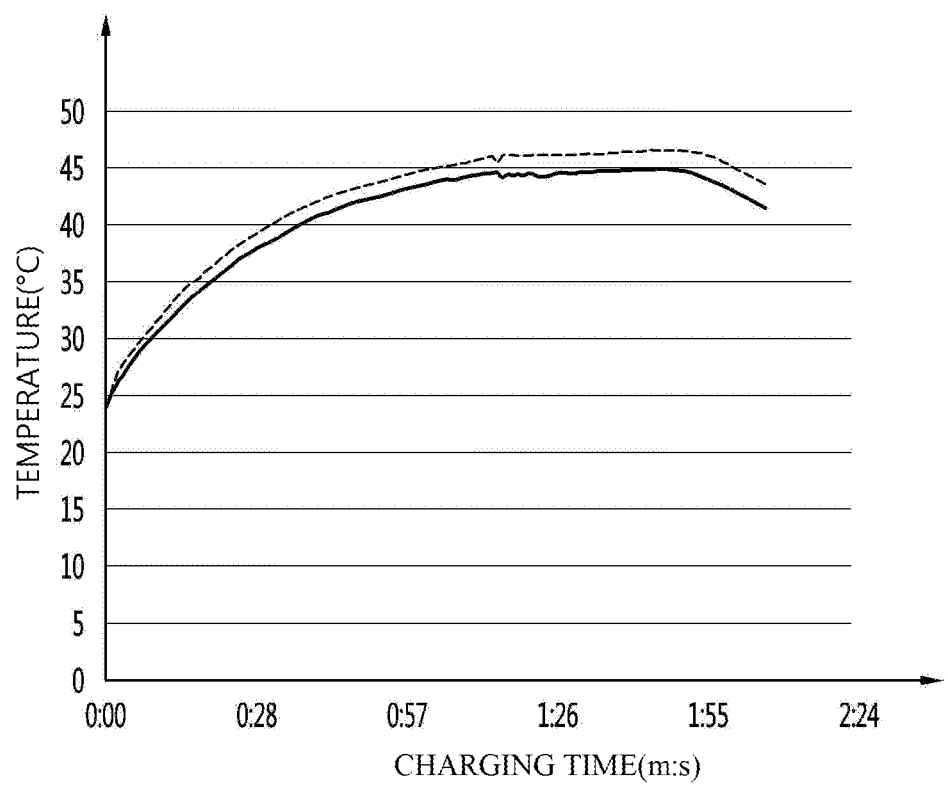

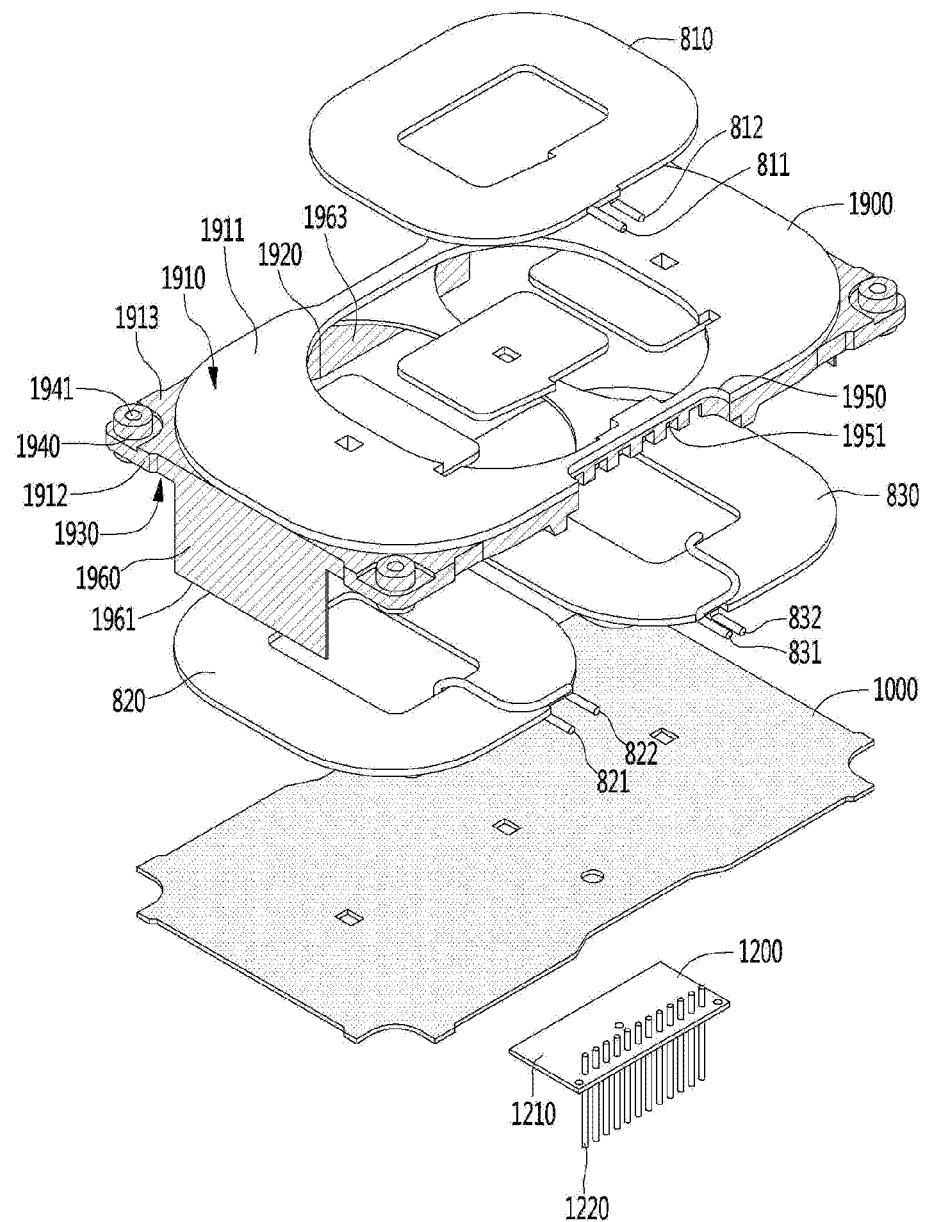
[FIG. 13]

[FIG. 14]
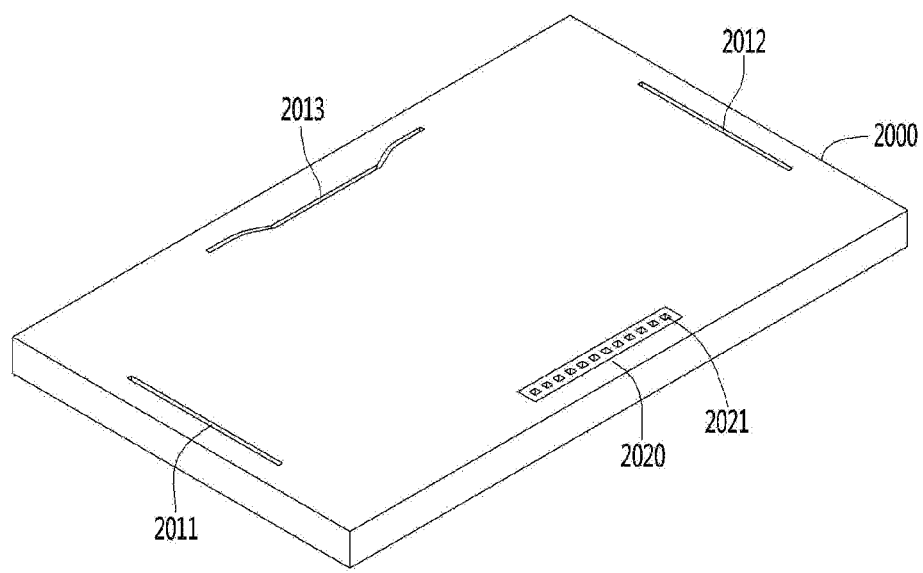
[FIG. 15]
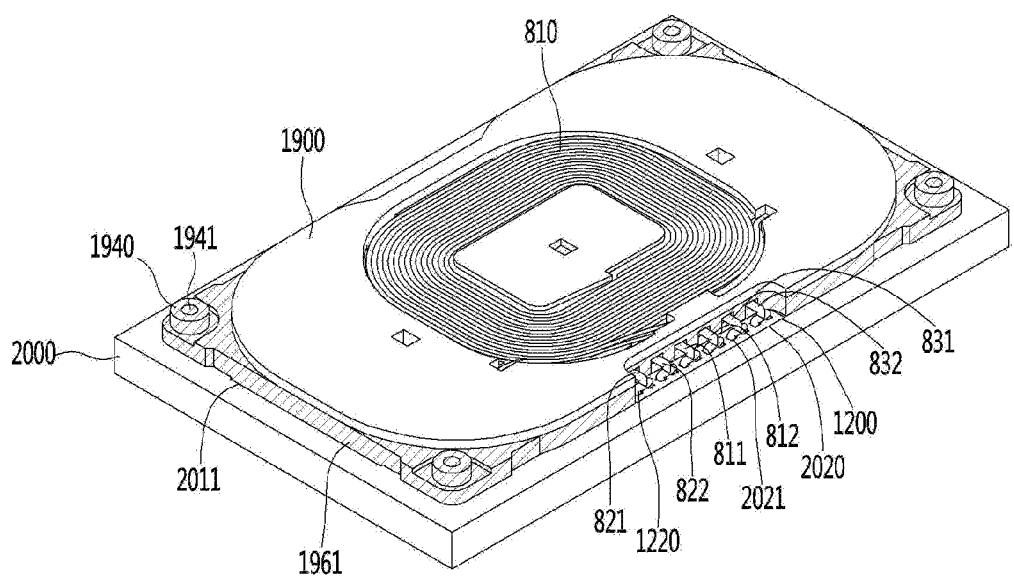

[FIG. 16]
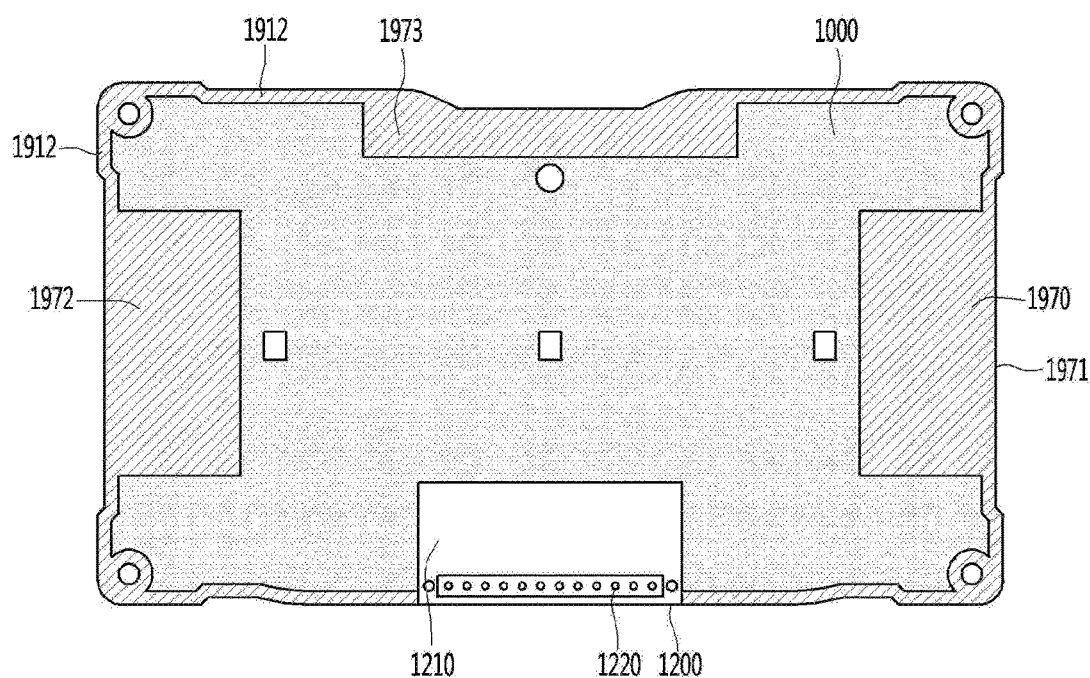
[FIG. 17]
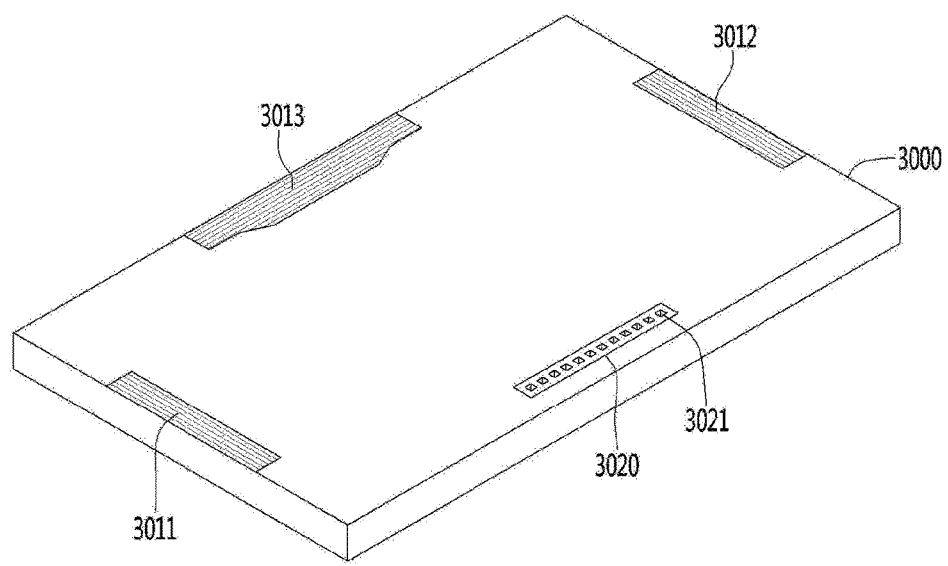

[FIG. 18]
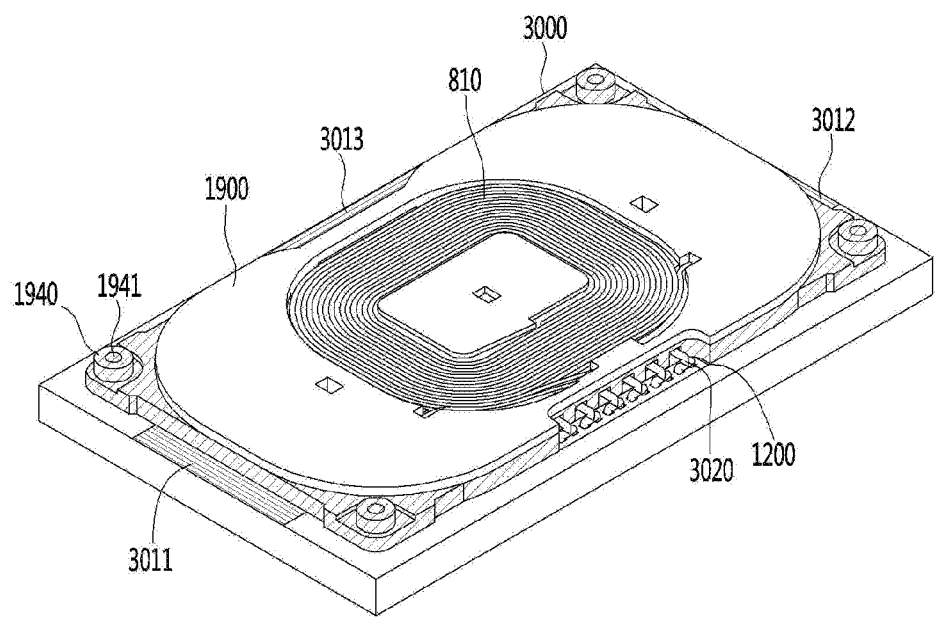

[FIG. 19]
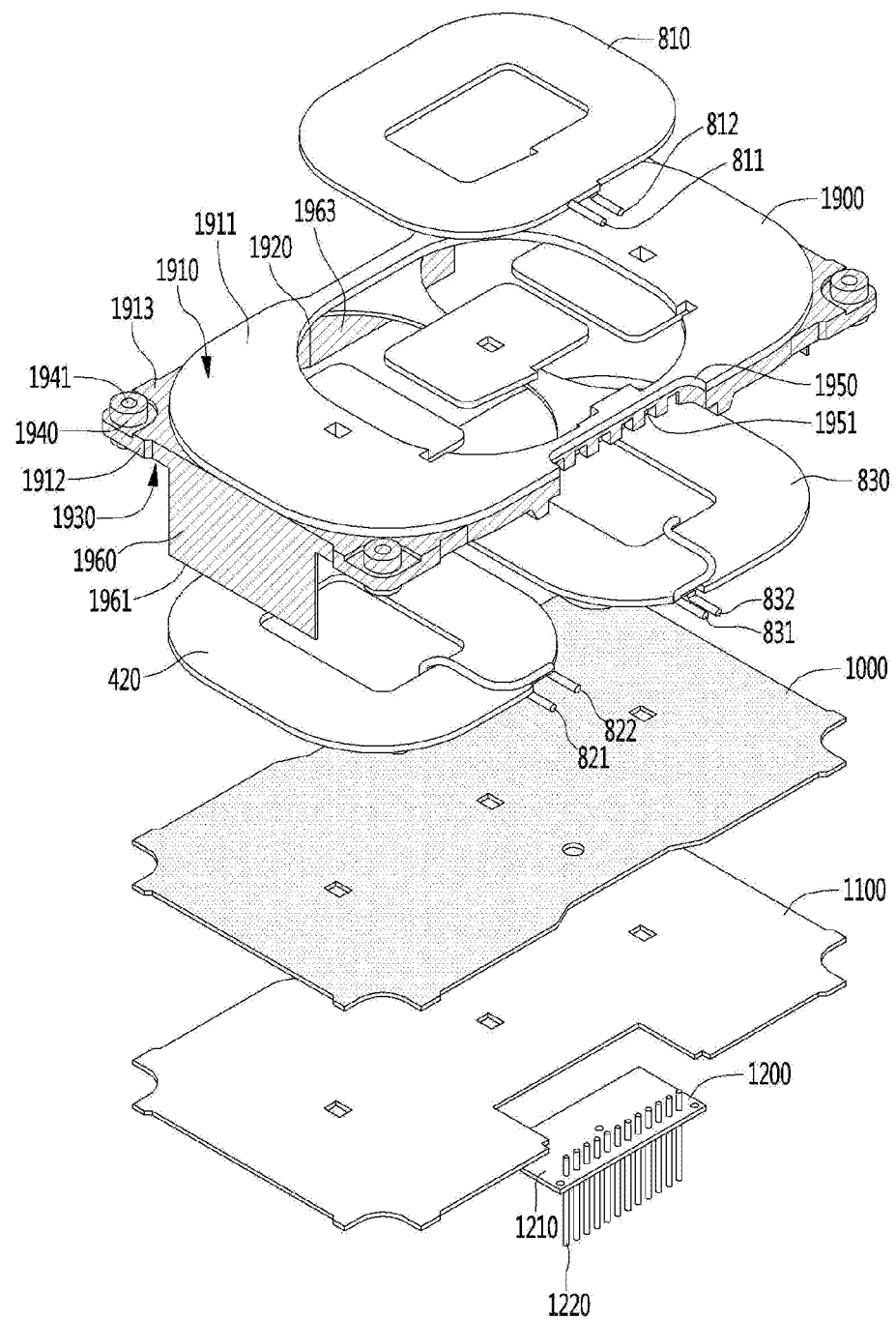

COIL DEVICE

CROSS REFERENCE TO RELATED APPLICATIONS

This application is the National Phase of PCT International Application No. PCT/KR2018/002579, filed on Mar. 5, 2018, which claims priority under 35 U.S.C. 119(a) to Patent Application Nos. 10-2017-0028275, filed in the Republic of Korea on Mar. 6, 2017 and 10-2017-0028283, filed in the Republic of Korea on Mar. 6, 2017, all of which are hereby expressly incorporated by reference into the present application.

TECHNICAL FIELD

The present embodiment relates to a coil device.

BACKGROUND ART

A portable terminal such as a mobile phone or a notebook computer includes a battery for storing electric power and a circuit for charging and discharging the battery. In order to charge the battery of such a terminal, electric power should be supplied from an external charger.

Generally, as an example of an electrical connection method between a battery and a charging device for charging electric power to the battery, there is a terminal supply method in which commercial power is supplied and converted into voltage and current corresponding to the battery to supply electric energy to the battery through a terminal of the battery. Such a terminal supply method requires use of a physical cable or an electric wire. Therefore, when a lot of devices of the terminal supply method are used, a lot of cables occupy a considerable work space and are difficult to organize, and are not good in appearance. Further, the terminal supply method may cause problems such as instantaneous discharge due to different electric potential differences between terminals, occurrence of burnout or fire due to foreign matters, spontaneous discharge, and deterioration in lifespan and performance of the battery, etc.

Recently, in order to solve such problems, a charging system (hereinafter referred to as "wireless charging system") using a method of transmitting power wirelessly and control methods have been proposed. In addition, in the past, wireless charging systems were not standard on some portable devices, and consumers had to purchase separate wireless charging receiver accessories, so that the demand for wireless charging systems was low. In the future, it is expected that the number of users using wireless charging will increase rapidly and terminal manufacturers will basically be equipped with a wireless charging function.

In general, a wireless charging system includes a wireless power transmitter that supplies electric energy by a wireless power transmission method, and a wireless power receiver that receives electric energy supplied from the wireless power transmitter and charges a battery.

Meanwhile, in order to transmit wireless power, the wireless power transmitter includes a transmission coil, and in order to receive wireless power, the wireless power receiver includes a reception coil. The transmission coil or the reception coil may include a plurality of cables for input/output of AC signals, for example, input/output wires. As the number of input/output wires increases, there is a problem that a process for connection to an external configuration becomes complicated or the number of processes increases. In addition, there is a problem that the durability of the transmission/reception coil is lowered due to the movement of the input/output wires.

Meanwhile, as an output amount of wireless power transmitted from the wireless power system has increased, heat generated in the transmitting/reception coil has increased. When heat is increased in the transmission/reception coil, there is a problem that the transmission efficiency of the wireless power decreases.

Technical Problem

The present embodiment has been devised to solve the above-described problems of the related art, and the present invention is directed to providing a coil device and a wireless power transmitting/receiving apparatus including the coil device.

In addition, in the present embodiment, input/output wires of a transmission/reception coil may be fixed to simplify the installation of the coil device.

Further, the present embodiment may increase durability of the transmission/reception coil by fixing the input/output wires of the transmission/reception coil.

In addition, the present embodiment provides a coil device provided with a heat dissipating member capable of thermal diffusing efficiently.

Further, the present embodiment provides a coil device provided with a coil frame capable of thermal diffusing efficiently.

Technical problems to be solved in the present invention are not limited to the above mentioned technical problems, and other technical problems not mentioned will be clearly understood by a person having ordinary skill in the art, to which the present invention pertains, from the following descriptions.

Technical Solution

A coil device according to the present embodiment includes: first to third coils including a connecting portion; and a coil frame including an upper receiving portion for housing the first coil, a lower receiving portion for housing the second and third coils, and a cable fixing portion for fixing each connecting portion of the first to third coils.

In addition, a coil device according to the present embodiment includes: first to third coils; a coil frame including an upper receiving portion for housing the first coil, and a lower receiving portion for housing the second and third coils; a shielding material housed in the lower receiving portion and disposed at a lower end of the second and third coils; and a heat dissipating member housed in the lower receiving portion and disposed at a lower end of the shielding material.

Advantageous Effects

Effects of a coil device according to the present embodiment will be described as follows.

The present embodiment may provide a coil device.

In addition, the present embodiment may provide a coil device capable of fixing input/output wires of a transmitting/reception coil with a simple structure.

Further, the present embodiment may provide a coil device in which the input/output wires of the transmission/reception coil are fixed and a connection process with an external configuration for inputting/outputting signals is simple.

Furthermore, the present embodiment may provide a coil device with high durability by preventing movement of the input/output wires of the transmitting/reception coil.

In addition, the present embodiment may provide a coil device that may efficiently improve heat.

Further, in the present embodiment, heat of a coil device may be improved by using a thin heat dissipating member.

Furthermore, in the present embodiment, heat of a coil device may be improved by using a coil frame having a simple structure.

In addition, the present embodiment may provide a coil device with improved durability and a wireless power transmitting/receiving apparatus including the coil device.

Further, the present embodiment may provide a coil device that are improved in heat and increase wireless power charging efficiency.

The effects expected in the present embodiment are not limited to the foregoing effects, and other effects not mentioned above will be also easily understood from the above detailed descriptions by a person having an ordinary skill in the art to which the present embodiments pertain.

DESCRIPTION OF DRAWING PORTIONS

FIG. 1 is a block diagram for describing a wireless charging system according to an embodiment.

FIG. 2. is a block diagram for describing a structure of a wireless power transmitter according to an embodiment.

FIG. 3 is a block diagram for describing a structure of a wireless power receiver interworking with the wireless power transmitter according to FIG. 2.

FIG. 4 is an exploded perspective view of a coil device according to one embodiment.

FIG. 5 is a plan view of a coil frame of a coil device according to one embodiment.

FIG. 6 is a plan view of an upper portion of a coil device according to one embodiment.

FIG. 7 is a side view of a coil device according to one embodiment.

FIG. 8 is a plan view of a lower portion of a coil device according to one embodiment.

FIG. 9 is an exploded perspective view of a coil device according to another embodiment.

FIG. 10 is a plan view of a coil device according to another embodiment.

FIG. 11 shows a state in which a heat dissipating member is disposed on a shielding material of a coil device according to another embodiment.

FIG. 12 is a graph showing heat dissipation efficiency according to a kind of heat dissipating member in a coil device according to another embodiment.

FIG. 13 is an exploded perspective view of a coil device according to still another embodiment.

FIG. 14 is a perspective view for describing a coil mount in which a coil device according to still another embodiment is installed.

FIG. 15 is a view for describing a state in which the coil device of FIG. 13 is disposed on the mount of FIG. 14.

FIG. 16 is a plan view of a lower portion of a coil device according to still another embodiment.

FIG. 17 is a perspective view for describing a coil mount on which the coil device of FIG. 16 is installed.

FIG. 18 is a view for describing a state in which the coil device of FIG. 16 is disposed on the mount of FIG. 17.

FIG. 19 is an exploded perspective view of a coil device according to still another embodiment.

MODES OF THE INVENTION

Hereinafter, apparatus and various methods according to embodiments will be described in detail with reference to the accompanying drawing portions. Suffixes "module" and "part" for elements used in the following descriptions are given or used just for convenience in writing the specification, and do not have meanings or roles distinguishable between them.

Although all elements described in above embodiments are combined into one or operate as they are combined, the present disclosure is not limited to the embodiments. In other words, one or more elements among all of them may be selectively combined and operate without departing from the scope of the present disclosure. Further, all the elements may be respectively materialized as single independent hardware components, but some or all of them may be selectively combined and materialized as a computer program having a program module to perform some or all functions combined in a single or plural hardware components. Codes and code segments of the computer program may be easily conceived by a person having an ordinary skill in the art. Such a computer program may be stored in computer readable media, and read and executed by a computer, thereby materializing the embodiments. The medium for storing the computer program may include a magnetic recording medium, an optical recording medium, a carrier wave medium, etc.

In describing the embodiments, if elements are described with terms "above (up) or below (down)", "front (head) or back (rear)", the terms "above (up) or below (down)", "front (head) or back (rear)" may refer to meanings of direct contact between two elements or one or more elements interposed between the two elements.

In addition, it will be understood that the term "include", "comprise" or "have", etc. used as above means a presence of an element unless otherwise stated, and does not preclude the presence or addition of one or more other elements. Unless otherwise defined, all terms including technical and scientific terms used herein have the same meaning as commonly understood by one of ordinary skill in the art to which this invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Further, elements of the present disclosure may be described with terms first, second, A, B, (a), (b), etc. These terms are only used to distinguish one element from another, and do not limit the element's own meaning, sequence, order, etc. It will be understood that when an element is referred to as being "connected", "combined" or "coupled" to another element, it may be directly connected or coupled to the other element or intervening elements may be "connected", "combined" or "coupled" between the elements.

Furthermore, in the present disclosure, detailed descriptions of the related well-known art may be omitted if the well-known art is obvious to those skilled in the art and may cloud the gist of the present disclosure.

In describing embodiments, an apparatus for wirelessly transmitting electric power in a wireless power charging system may be also called a wireless power transmitter, a wireless power transmission apparatus, a transmitting terminal, a transmitter, a transmitting apparatus, a transmitting side, a wireless power transmitting apparatus, a wireless power transmitter, a wireless charging apparatus, or the like for convenience of description. Further, an apparatus for wirelessly receiving electric power from the wireless power sending apparatus may be also called a wireless power receiving apparatus, a wireless power receiver, a receiving terminal, a receiving side, a receiving apparatus, a receiver terminal, or the like for convenience of description.

The wireless charging apparatus according to an embodiment may be provided as a pad type, a support type, an access point (AP) type, a small base station type, a stand type, a ceiling embedded type, a wall mount type, etc. and one transmitter may transmit electric power to a plurality of wireless power receiving apparatuses.

For example, the wireless power transmitter may be typically used when put on a desk or table and also used in a vehicle when developed for a vehicle. The wireless power transmitter installed in the vehicle may be provided as a support type to be conveniently and stably held and supported.

A terminal according to an embodiment may be used for a small electronic device such as a mobile phone, a smart phone, a notebook computer (or a laptop computer), a digital broadcasting terminal, a personal digital assistant (PDA), a portable multimedia player (PMP), a global positioning system (GPS), an MP3 player, an electric toothbrush, an electronic tag, an illumination system, a remote controller, a fishing float, or the like, but not limited thereto. Alternatively, the terminal may include any mobile device (hereinafter referred to as an "electronic device") provided with a wireless power receiving means according to an embodiment and capable of battery charging, and the terms "terminal" and "device" may both be used. According to another embodiment, the wireless power receiver may be mounted to a vehicle, an unmanned aircraft, an air drone, etc.

According to an embodiment, the wireless power receiver may employ at least one wireless power transmission manner, and may simultaneously receive wireless power from two or more wireless power transmitters. Herein, the wireless power transmission manner may include at least one among an electromagnetic induction manner, an electromagnetic resonance manner, and an RF wireless power transmission manner. In particular, the wireless power receiving means supporting the electromagnetic induction manner may include the wireless charging technology of the electromagnetic induction manner defined in the AirFuel Alliance (formerly PMA) and Wireless Power Consortium (WPC), i.e. wireless charging technology standard organizations. Further, the wireless power receiving means supporting the electromagnetic resonance manner may include the wireless charging technology of the resonance manner defined in the Airfuel (formerly A4WP) standard organization, i.e. wireless charging technology standard organization.

In general, the wireless power transmitter and the wireless power receiver of the wireless power system may exchange a control signal or information through in-band communication or Bluetooth low energy (BLE) communication. Herein, in-band communication and BLE communication may be performed by a pulse width modulation (PWM) method, a frequency modulation (FM) method, a phase modulation (PM) method, an amplitude modulation (AM) method, an AM-PM method, etc. For example, the wireless power receiver generates a feedback signal by applying a predetermined on/off switching pattern to an electric current induced through a reception coil and thus transmits various control signals and information to the wireless power transmitter. The information received from the wireless power receiver may include various pieces of information such as a strength of received power. In this case, the wireless power transmitter may calculate a charging efficiency or a power transmission efficiency based on information about the strength of the received power.

FIG. 1 is a block diagram for describing a wireless charging system according to an embodiment.

Referring to FIG. 1, the wireless charging system may generally include a wireless power transmitter 10 for wirelessly transmitting power, a wireless power receiver 20 for receiving the transmitted power, and an electronic device 30 to which the received power is supplied.

For example, the wireless power transmitter 10 and the wireless power receiver 20 may perform in-band communication for exchanging information using the same frequency band as an operation frequency used in wireless power transmission. As another example, the wireless power transmitter 10 and the wireless power receiver 20 may perform out-of-band communication for exchanging information using another frequency band different from the operation frequency used in wireless power transmission.

As an example, the information exchanged between the wireless power transmitter 10 and the wireless power receiver 20 may include not only state information of each other but also control information. Here, the state information and the control information exchanged between the transmitting and receiving terminals be further clarified by descriptions of embodiments described later.

The in-band communication and the out-of-band communication may provide bidirectional communication, but are not limited thereto, and in other embodiments, one-way communication or half-duplex communication may be provided.

As an example, one-way communication may refer that the wireless power receiver 20 transmits information only to the wireless power transmitter 10, but is not limited thereto, and may refer that the wireless power transmitter 10 transmits information to the wireless power receiver 20.

The half-duplex communication method allows bidirectional communication between the wireless power receiver 20 and the wireless power transmitter 10, but allows to transmit information by only one device at any a time point.

The wireless power receiver 20 according to an embodiment may acquire various state information of the electronic device 30. As an example, the state information of the electronic device 30 may include current power usage information, information for identifying running applications, usage rate information of a central processing unit (CPU), battery charge status information, battery output voltage/current information, etc., but the present embodiment is not limited thereto, and any information that may be acquired from the electronic device 30 and may be used for wireless power control is sufficient.

FIG. 2 is a block diagram for describing a structure of a wireless power transmitter according to an embodiment.

Referring to FIG. 2, a wireless power transmitter 200 may include a power converter 210, a power transmitter 220, a communicator 230, a controller 240, and a sensor 250, largely. The configuration of the wireless power transmitter 200 is not an essential configuration, and thus it should be noted that it is possible to include more or less elements than these elements.

As shown in FIG. 2, when receiving power from a power supply 260, the power converter 210 may perform a function for converting the power into power having a predetermined strength.

To this end, the power converter 210 may include a DC/DC converter 211 and an amplifier 212.

The DC/DC converter 211 may perform a function of converting DC power supplied from the power supply 260 into DC power having a specific strength in accordance with a control signal of the controller 240.

In this case, the sensor 250 may measure voltage/current, etc. of the DC-converted power and provide them to the controller 240. In addition, the sensor 250 may measure an internal temperature of the wireless power transmitter 200 to determine whether overheating occurs, and provide the measured result to the controller 240. As an example, the controller 240 may adaptively cut off power supplied from the power supply 260 or prevent the power from being supplied to the amplifier 212 on the basis of a voltage/current value measured by the sensor 250. To this end, a predetermined power cut-off circuit for cutting off power supplied from the power supply 260 or cutting off power supplied to the amplifier 212 may be further provided at one side of the power converter 210.

The amplifier 212 may adjust a strength of DC/DC converted power in accordance with the control signal of the controller 240. As an example, the controller 240 may receive power receiving state information of a wireless power receiver and/or a power control signal through the communicator 230, and dynamically adjust an amplification rate of the amplifier 212 based on the received power receiving state information and/or the received power control signal. As an example, the power receiving state information may include strength information on an output voltage of a rectifier, strength information on a current applied to a reception coil, etc., but the present embodiment is not limited thereto. The power control signal may include a signal for requesting an increase in the power, a signal for requesting a decrease in the power, and the like.

The power transmitter 220 may include a multiplexer 221 and a transmission coil 222. In addition, the power transmitter 220 may further include a carrier wave generator (not shown) for generating a specific operation frequency to transmit the power.

The carrier wave generator may generate a specific frequency to convert output DC power of the amplifier 212 received through the multiplexer 221 into AC power having a specific frequency. In the above description, an AC signal generated by the carrier wave generator is mixed at an output terminal of the multiplexer 221 to generate AC power, but this is merely an embodiment. In another example, it should be noted that the AC signal may be mixed at an anterior or posterior terminal of the amplifier 212.

As shown in FIG. 2, the power transmitter 220 may include the multiplexer 221 and a plurality of transmission coils 222—i.e., first to nth transmission coils—to control the output power of the amplifier 212 to be transferred to the transmission coil.

When a plurality of wireless power receivers are connected, the controller 240 according to an embodiment may transfer the power through time-division multiplexing for each transmission coil. For example, when three wireless power receivers—i.e., first to third wireless power receivers—are identified through three different transmission coils—i.e., the first to third transmission coils—at the wireless power transmitter 200, the controller 240 may control the multiplexer 221 to control such that the power may be transferred to a specific timeslot through a specific transmission coil. In this case, an amount of power transferred to a corresponding wireless power receiver may be controlled in accordance with lengths of timeslots assigned for each transmission coil, but this is merely an embodiment. In another example, the amplification rate of the amplifier 212 may be controlled during the timeslot assigned for each transmission coil to control the power transmitted for each wireless power receiver.

The controller 240 may control the multiplexer 221 such that a sensing signals may be sequentially transmitted through the first to nth transmission coils 222 during a primary sensing signal transmission process. In this case, the controller 240 may identify a time point at which the sensing signals are transmitted by using a timer 255, and when the time point of the sensing signal transmission reaches, the controller 240 may control the multiplexer 221 to control such that the sensing signal may be transmitted through the corresponding transmission coil. As an example, the timer 255 may transmit a specific event signal to the controller 240 at a predetermined cycle during a ping transfer phase, and when the corresponding event signal is sensed, the controller 240 may control the multiplexer 221 to control such that a digital ping may be transmitted through the corresponding transmission coil.

In addition, during the primary sensing signal transmission process, the controller 240 may receive a predetermined transmission coil identifier, which identifies whether a signal strength indicator has been received through a certain transmission coil, from a demodulator 232 and receive the signal strength indicator received through the corresponding transmission coil. Continuously, during a secondary sensing signal transmission process, the controller 240 may control the multiplexer 221 such that the sensing signals may be transmitted through only the transmission coil(s) in which the signal strength indicator is received during the primary sensing signal transmission process. As another example, when there are a plurality of transmission coils in which the signal strength indicator is received during the primary sensing signal transmission process, the controller 240 may determine the transmission coil in which the signal strength indicator having the highest value is received as the transmission coil for transmitting a sensing signal first during the secondary sensing signal transmission process, and may control the multiplexer 221 in accordance with the determination result.

A modulator 231 may modulate the control signal generated by the controller 240 and transmit it to the multiplexer 221. Here, a method of modulating the control signal may include a frequency shift keying (FSK) modulation method, a Manchester coding modulation method, a phase shift keying (PSK) modulation method, a pulse width modulation (PWM) method, a differential bi-phase modulation method, and the like, but the present embodiment is not limited thereto.

When sensing a signal received through the transmission coil, the demodulator 232 demodulates the sensed signal and transmits it to the controller 240. Herein, the demodulated signal may include a signal strength indicator, an error correction (EC) indicator for controlling power during the wireless power transfer, an end-of-charge (EOC) indicator, an overvoltage/overcurrent/overheat indicator, and the like, but the present embodiment is not limited thereto, and may include various pieces of status information for identifying the state of the wireless power receiver.

In addition, the demodulator 232 may identify which transmission coil the demodulated signal is received from, and may provide a predetermined transmission coil identifier corresponding to the identified transmission coil to the controller 240.

As an example, the wireless power transmitter 200 may obtain the signal strength indicator through in-band communication that uses the same frequency used for wireless power transmission to communicate with the wireless power receiver.

In addition, the wireless power transmitter 200 may not only transmit the wireless power using the transmission coil 222, but may also exchange various pieces of information with the wireless power receiver via the transmission coil 222. As another example, the wireless power transmitter 200 may additionally include a separate coil corresponding to each of the transmission coils 222—i.e., the first to nth transmission coils—, and it should be noted that the in-band communication may be performed with the wireless power receiver by using the included separate coil.

As described above, in the description of FIG. 2, a case in which the wireless power transmitter 200 and the wireless power receiver perform the in-band communication is described as an example, but this is merely an embodiment, and it may perform short-distance bidirectional communication through a frequency band different from the frequency band used for transmitting a wireless power signal. As an example, the short-distance bidirectional communication may be any one of low power Bluetooth communication, radio-frequency identification (RFID) communication, ultra-wideband (UWB) communication, and ZigBee communication.

In particular, the transmission coil 222 may be a coil device shown in FIGS. 4 to 19 described later.

FIG. 3 is a block diagram for describing a structure of a wireless power receiver interworking with the wireless power transmitter according to FIG. 2.

Referring to FIG. 3, a wireless power receiver 300 may include a reception coil 310, a rectifier 320, a DC/DC converter 330, a load 340, a sensor 350, a communicator 360, and a main controller 370. Here, the communicator 360 may include at least one of a demodulator 361 and a modulator 362.

The wireless power receiver 300 shown in an example of FIG. 3 is shown to be able to exchange information with the wireless power transmitter via in-band communication, but this is merely one embodiment, and the communicator 360 according to another embodiment may provide short-distance bidirectional communication via a frequency band different from the frequency band used for transmitting a wireless power signal.

AC power received via the reception coil 310 may be transferred to the rectifier 320. The rectifier 320 may convert the AC power into DC power and transmit it to the DC/DC converter 330. The DC/DC converter 330 may convert a strength of the DC power output from the rectifier into a specific strength required by the load 340, and then may transfer it to the load 340. In addition, the reception coil 310 may include a plurality of reception coil (not shown), that is, first to nth reception coils. Frequencies of the AC power transmitted to each of the reception coils (not shown) according to one embodiment may be different from each other, and in another one embodiment, the resonance frequency for each reception coil may be set to be different by using a predetermined frequency controller having a function of adjusting LC resonance characteristics to be different for each reception coil.

In particular, the reception coil 310 may be a coil device shown in FIGS. 4 to 8 described later.

The sensor 350 may measure the strength of the DC power output from the rectifier 320, and may provide it to the main controller 370. In addition, the sensor 350 may measure intensity of a current applied to the reception coil 310 in accordance with reception of the wireless power, and may transmit the measured result to the main controller 370. Further, the sensor 350 may measure an internal temperature of the wireless power receiver 300, and may provide a measured temperature value to the main controller 370.

As an example, the main controller 370 may compare the measured strength of the DC power output from the rectifier with a predetermined reference value to determine whether an overvoltage occurs or not. As a result of the determination, when the overvoltage occurs, the main controller 370 may generate a predetermined packet notifying that the overvoltage has occurred to transmit it to the modulator 362. Here, a signal modulated by the modulator 362 may be transmitted to the wireless power transmitter via the reception coil 310 or a separate coil (not shown). In addition, when the strength of the DC power output from the rectifier is equal to or higher than the predetermined reference value, the main controller 370 may determine that a sensing signal is received, and may control such that a signal strength indicator corresponding to the sensing signal may be transmitted to the wireless power transmitter via the modulator 362 when the sensing signal is received. As another example, the demodulator 361 may modulate an AC power signal or a DC power signal output from the rectifier 320 between the reception coil 310 and the rectifier 320 to identify whether a sensing signal is received or not, and then may provide the identification result to the main controller 370. At this time, the main controller 370 may control such that the signal strength indicator corresponding to the sensing signal may be transmitted via the modulator 362.

<Coil Device According to One Embodiment>

FIG. 4 is an exploded perspective view of a coil device according to one embodiment.

The coil device according to one embodiment may be at least one of a transmission coil of a wireless power transmitting apparatus and a reception coil of a wireless power receiving apparatus. In addition, the coil device is not limited to the wireless power transmitting apparatus, and may be applied to an apparatus using a coil that wirelessly transmits an induced electromotive force.

Referring to FIG. 4, a coil device according to one embodiment may include a plurality of coils. The plurality of coils may be a plurality of transmission coils of a wireless power transmitting apparatus, or a plurality of reception coils of a wireless power receiving apparatus. In addition, the plurality of coils may be wound in the same number of turns, but are not limited thereto, and may be wound a different number of turns. Further, the plurality of coils may have the same inductance, but are not limited thereto, and may have different inductances. In addition, the plurality of coils may be disposed in one or more layers. More specifically, the plurality of coils may include a first coil 410 to a third coil 430. The second coil 420 and the third coil 430 may be disposed on a first layer disposed on the same layer. The first coil 410 may be disposed on a second layer disposed on upper portions of the second coil 420 and the third coil 430. Therefore, the coil device according to one embodiment may extend a charging area such that the plurality of coils may be disposed in different layers to efficiently transmit wireless power.

Further, the plurality of coils may include first and second connecting portions to or from which an AC signal is input or output, respectively. The first and second connecting portions may be wires or cables coated with sheath. The first and second connecting portions may be connected to an external configuration of the coil device. As an example, in case of a wireless power transmitter, the first and second connecting portions may be connected to a power converter or a multiplexer directly or via a terminal. In case of a wireless power receiver, the first and second connecting portions may be connected to a rectifier directly or via the terminal. More specifically, the first coil 410 may include a first-first connecting portion 411 and a first-second connecting portion 412. The first-first connecting portion 411 may extend from a coil wire disposed inside the first coil 410. The first-second connecting portion 412 may extend from a coil wire disposed outside the first coil 410. The present embodiment is not limited thereto, and the first-first connecting portion 411 may extend from an outer coil wire of the first coil 410, and the first-second connecting portion 412 may extend from an inner coil wire of the first coil 410. The second coil 420 may include a second-first connecting portion 421 and a second-second connecting portion 422. The second-first connecting portion 421 may extend from a coil wire disposed inside the second coil 420. The second-second connecting portion 422 may extend from a coil wire disposed outside the second coil 420. The present embodiment is not limited thereto, and the second-first connecting portion 421 may extend from an outer coil wire of the second coil 420, and the second-second connecting portion 422 may extend from an inner coil wire of the second coil 420. The third coil 430 may include a third-first connecting portion 431 and a third-second connecting portion 432. The third-first connecting portion 431 may extend from a coil wire disposed outside the third coil 430. The third-second connecting portion 432 may extend from a coil wire disposed inside the third coil 430. The present embodiment is not limited thereto, and the third-first connecting portion 431 may extend from an inner coil wire of the third coil 430, and the third-second connecting portion 432 may extend from an outer coil wire of the third coil 430.

Furthermore, each of first and second connection wires of the plurality of coils may extend from each coil in the same direction of one side surface of the coil device. More specifically, each of the first and second connection wires of the plurality of coils may be disposed extending in a direction of a cable fixing portion 550 disposed on one side of a coil frame 500. For example, the first-first connecting portion 411 and the first-second connecting portion 412 of the first coil 410, the second-first connecting portion 421 and the second-second connecting portion 422 of the second coil 420, and the third-first connecting portion 431 and the third-second connecting portion 432 of the third coil 430 may be disposed to extend in a direction of the cable fixing portion 550 disposed on one side of the coil frame 500.

A coil device according to one embodiment may include a coil frame 500.

The coil frame 500 may include an upper receiving portion 520 in which a coil is disposed. The upper receiving portion 520 may be disposed on an outer upper portion 511 of the coil frame 500. The upper receiving portion 520 may be shaped like an opening or a recess. For example, as shown in FIG. 4, the first coil 410 may be disposed in the upper receiving portion 520 having an opening shape. In addition, when the upper receiving portion 520 has the opening shape, the upper receiving portion 920 may include one or more coil supporting portions 521 for supporting the coil. For example, the first coil 410 disposed at the upper receiving portion 520 having the opening shape may be disposed to be in contact with an upper surface of the coil supporting portion 521.

In addition, the coil frame 500 may include a lower receiving portion 530. The lower receiving portion 530 may be formed by the outer upper portion 511 and the inner portion 513 of the coil frame 500. The lower receiving portion 520 may house a coil, a shielding material 600, or a heat dissipating sheet 700. For example, as shown in FIG. 4, in the lower receiving portion 530, the second coil 420 and the third coil 430 may be disposed on the same layer, the shielding material 600 may be disposed on a lower layer of the second coil 420 and the third coil 430, and the heat dissipating sheet 700 may be disposed on a lower layer of the shielding material 600.

The coil frame 500 according to one embodiment may include a coil frame fixing portion 540. The coil frame fixing portion 540 may have a shape protruding from an outer portion at corners of the coil frame 500. The coil frame fixing portion 540 may include a coil frame fixing hole 541 such that the coil frame fixing portion 540 may be fixed to an external device. That is, screws, bolts and nuts, fixing bars, or the like may be inserted into the coil frame fixing hole 541 in order to mount or install the coil device on the external device.

The coil frame 500 according to one embodiment may include a coil fixing portion 550. The coil fixing portion 550 may fix a connecting portion of the coil. Detailed description of the coil fixing portion 550 will be described later.

A coil device according to one embodiment may include a shielding material 600. The shielding material 600 may be disposed in the lower receiving portion 530 of the coil frame 500. The shielding material 600 may be disposed on a lower surface of the plurality of coils. The shielding material 600 may guide the wireless power generated by the plurality of coils disposed in the upper portion thereof in a charging direction, and may protect various circuits disposed in the lower portion of the coil device from an electromagnetic field. The shield 600 may include a first-first fastening hole 610 and a first-second fastening hole 620 in order to separate or prevent movement in the coil device.

A coil device according to one embodiment may include a heat dissipating sheet 700. The heat dissipating sheet 700 may be disposed in the lower receiving portion 530 of the coil frame 500. The heat dissipating sheet 700 may be disposed on a lower surface of the shielding material 600. When heat generated from a plurality of coils is transferred through the shielding material 600, the heat dissipating sheet 700 may release the heat to the outside of the coil device. The heat dissipating sheet 700 may be made of a material having high thermal conductivity or thermal emissivity. The heat dissipating sheet 700 may include a second-first fastening hole 710 and a second-second fastening hole 720 in order to separate or prevent movement in the coil device.

FIG. 5 is a plan view of a coil frame of the coil device according to one embodiment.

FIG. 5 is a view for describing a cable fixing portion 550 of a coil frame 500.

Referring to FIG. 5, the cable fixing portion 550 may fix a connecting portion extending from a plurality of coils to prevent movement of the coil or the connecting portion. In addition, the cable fixing portion 550 may be fixedly disposed by aligning the connecting portions of each coil in a row or regularly, thereby facilitating an electrical connection process between the connecting portion and an external power supply configuration. The cable fixing portion 550 may be disposed on an outer portion 512 of the coil frame

500. The cable fixing portion 550 may be integrated with the coil frame 500 by injection molding.

Further, the cable fixing portion 550 may include a plurality of guide portions 551 including a first protrusion portion 552 and a second protrusion portion 553, a cable supporting portion 554, or a lead-in portion 555.

The guide portion 551 may separate a plurality of connecting portions from each other, and may fix each connecting portion.

More specifically, the guide portion 551 may include the first protrusion portion 552 that protrudes in a first direction between one end on the outer side thereof and the other end on the inner side thereof. More specifically, the first protrusion portion 552 is positioned at the center of the guide portion 551 or positioned corresponding to the cable supporting portion 554, and may protrude in the first direction which is a direction of one adjacent guide portion 551. In addition, the first protrusion portion 552 may protrude in parallel with the cable supporting portion 554. Further, the first protrusion portion 552 may have a protruding shape of a triangle shape, a square shape, a rhombus shape, a saw-tooth shape, a round shape, or the like. However, it is not limited thereto, and the shape of the first protrusion portion 552 may be determined depending on a material, a thickness, and the like of the connecting portion.

In addition, the guide portion 551 may include the second protrusion portion 553 that is positioned at one end on the outer side thereof and protrudes in a second direction that is opposite to the first direction. More specifically, the second protrusion portion 553 is positioned at one end of the guide portion 551 and may protrude in the second direction that is a direction of the other adjacent guide portion 551. The second protrusion portion 553 may protrude in parallel with the cable supporting portion 554. The second protrusion portion 553 have a protruding shape of a triangle shape, a square shape, a rhombus shape, a saw-tooth shape, a round shape, or the like. However, it is not limited thereto, and the shape of the second protrusion portion 553 may be determined depending on a material, a thickness, and the like of the connecting portion. Further, the shape of the first protrusion portion 552 and the shape of the second protrusion portion 553 may be the same. However, it is not limited thereto, and the shape of the first protrusion portion 552 and the shape of the second protrusion portion 553 may be different.

In addition, the guide portion 551 may be disposed such that one end on the outer side thereof protrudes further than the outer portion 512 of the coil frame 500. For example, the outer side of the guide portion 551 may protrude further than the outer portion 512 by a first distance a. Therefore, the guide portion 5510 may ensure a sufficient thickness for the second protrusion portion 553 to protect the connecting portion. Further, the outer side of the guide portion 551 may protrude by a distance equal to or smaller than a coil frame fixing portion 540 protruding from the outer portion 512.

Further, the guide portion 551 has a guide length from the one end on the outer side thereof to the other end on the inner side thereof, and the other end of the inner side thereof may be disposed to be spaced apart from an upper receiving portion 520 by a predetermined distance. For example, in the guide portion 551, the other end on the inner side thereof may disposed to extend by a second distance b that is a guide length from the outer portion 512 of the coil frame 500 in an inward direction. Therefore, the guide portion 551 may be disposed in the direction of the first protrusion portion 552 for separating the plurality of connecting portions from each other by a sufficient distance and fixing the connecting portions. Further, in the guide portion 551, the other end on the inner side thereof may be disposed to be spaced apart from the upper receiving portion 520 in an outward direction by the third distance c. Therefore, the guide portion 551 may prevent resistance from increasing by preventing a sudden bending of the connecting portion extending from each coil.

The cable supporting portion 554 may support the connecting portion such that the connecting portion does not move in the downward direction of the cable fixing portion 550. The cable supporting portion 554 may be fixed together with the first protrusion portion 552 so as not to move in the vertical and horizontal directions of the connecting portion. Further, the cable supporting portion 554 may be disposed corresponding to the first protrusion portion 552. More specifically, the cable supporting portion 554 may be disposed in parallel with the protruding direction of the first protrusion portion 552.

The lead-in portion 555 may be disposed outside the cable fixing portion 550, and the connecting portion may be pulled in. The lead-in portion 555 may be formed by one end outside the other guide portion 551 adjacent to the second protrusion portion 553 of one guide portion 551. That is, the lead-in portion 555 may be formed such that outer ends of the other guide portion 551 adjacent to the second protrusion portion 552 of the one guide portion 551 are separated from each other by a thickness of the connecting portion. The lead-in portion 555 may be an insertion path for the connecting portion to be disposed between the second protrusion portion 553 and the cable supporting portion 554 when the connecting portion is fixed to the cable fixing portion 550.

FIG. 6 is a plan view of an upper portion of a coil device according to one embodiment, FIG. 7 is a side view of a coil device according to one embodiment, and FIG. 8 is a plan view of a lower portion of a coil device according to one embodiment.

FIG. 6 is a view for describing a state in which a plurality of coils are fixed to a cable fixing portion 550 of a coil frame 500.

Referring to FIG. 6, a first-first connecting portion 411 and a first-second connecting portion 412 of a first coil 410, a second-first connecting portion 421 and a second-second connecting portion 422 of a second coil 420, and a third-first connecting portion 431 and a third-second connecting portion 432 of a third coil 430 may be fixedly disposed at the cable fixing portions 550 of the coil frame 500.

As an example, the first-first connecting portion 411 of the first coil 410 may be disposed between a first guide portion 1551 and a second guide portion 2551. The first-first connecting portion 411 may contact a first-first protrusion portion 1552 of the first guide portion 1551 and the second guide portion 2551 to fix movement in a horizontal direction. In addition, as shown in FIG. 8, the first-first connecting portion 411 may contact a cable supporting portion 554 to fix movement in a downward direction. In addition, as shown in FIG. 7, the first-first connecting portion 411 may extend in a lower direction of the coil device or a direction of an external device (not shown) by a second-second protrusion 2553 of the second guide portion 2551, and may be fixed. The first-first connecting portion 411 may contact the cable supporting portion 554, the first-first protrusion portion 1552, and the second-second protrusion portion 2553, respectively to prevent movement in the vertical and horizontal directions. As described above, the first-second connecting portion 412 of the first coil 410, the second-first connecting portion 421 and the second-second connecting portion 422 of the second coil 420, and the third-first connecting portion 431 and the third-second connecting portion 432 of the third coil 430 may be fixedly disposed on the cable fixing portion 550 of the coil frame 500.

Referring to FIG. 8, the coil device may include a plurality of member fixing portions. For example, the member fixing portions may include a first member fixing portion 561 and a second member fixing portion 562. The member fixing portion may be formed integrally with the coil frame 500, or may be a separate configuration. The member fixing portion may fix a shielding member 600 or a heat dissipation sheet 700. For example, a first member fixing portion 710 may be fastened passing through a first-first fastening hole 610 of the shielding material 600 and a second-first fastening hole 710 of the heat dissipation sheet 700 in order. A second member fixing portion 720 may be fastened passing through a first-second fastening hole 620 of the shielding material 600 and a second-second fastening hole 720 of the heat dissipation sheet 700 in order. In addition, when the member fixing portion is in plural, sizes of the member fixing portions may be different from each other. Thus, the coil frame may be prevented from being disposed in a wrong direction during a process of disposing the coil frame in the coil device. For example, a diameter of the first member fixing portion 710 may be larger than that of the second member fixing portion 720.

<Coil Device According to Another Embodiment>

FIG. 9 is an exploded perspective view of a coil device according to another embodiment, FIG. 10 is a plan view of a coil device according to another embodiment, and FIG. 11 shows a state in which a heat dissipating member is disposed on a shielding material of a coil device according to another embodiment.

The coil device according to another embodiment may be at least one of a transmission coil of a wireless power transmitting apparatus and a reception coil of a wireless power receiving apparatus. In addition, the coil device is not limited to the wireless power transmitting apparatus, and may be applied to an apparatus using a coil that wirelessly transmits an induced electromotive force.

Referring to FIG. 9, a coil device according to another embodiment may include a plurality of coils.

The plurality of coils may be a plurality of transmission coils of a wireless power transmitting apparatus, or a plurality of reception coils of a wireless power receiving apparatus. In addition, the plurality of coils may be wound in the same number of turns, but are not limited thereto, and may be wound a different number of turns. Further, the plurality of coils may have the same inductance, but are not limited thereto, and may have different inductances.

In addition, the plurality of coils may be disposed in one or more layers. More specifically, the plurality of coils may include a first coil 810 to a third coil 830. As shown in FIG. 10, the second coil 820 and the third coil 830 may be disposed on a first layer disposed on the same layer. The first coil 810 may be disposed on a second layer disposed on upper portions of the second coil 820 and the third coil 830. Therefore, the coil device according to another embodiment may extend a charging area such that the plurality of coils may be disposed in different layers to efficiently transmit wireless power.

Further, the plurality of coils may include first and second connecting portions to or from which an AC signal is input or output, respectively. The first and second connecting portions may be wires or cables coated with sheath. As shown in FIG. 5, the first and second connecting portions may be connected to connection pins 1220 of a male connector 1200 by a soldering process a. More specifically, the first coil 810 may include a first-first connecting portion 811 and a first-second connecting portion 812. The first-first connecting portion 811 may extend from a coil wire disposed outside the first coil 810. The first-second connecting portion 812 may extend from a coil wire disposed inside the first coil 810. The present embodiment is not limited thereto, and the first-first connecting portion 811 may extend from an inner coil wire of the first coil 810, and the first-second connecting portion 812 may extend from an outer coil wire of the first coil 810. The second coil 820 may include a second-first connecting portion 821 and a second-second connecting portion 822. The second-first connecting portion 821 may extend from a coil wire disposed outside the second coil 820. The second-second connecting portion 822 may extend from a coil wire disposed inside the second coil 820. The present embodiment is not limited thereto, and the second-first connecting portion 821 may extend from an inner coil wire of the second coil 820, and the second-second connecting portion 822 may extend from an outer coil wire of the second coil 820. The third coil 830 may include a third-first connecting portion 831 and a third-second connecting portion 832. The third-first connecting portion 831 may extend from a coil wire disposed inside the third coil 830. The third-second connecting portion 832 may extend from a coil wire disposed outside the third coil 830. The present embodiment is not limited thereto, and the third-first connecting portion 831 may extend from an outer coil wire of the third coil 830, and the third-second connecting portion 832 may extend from an inner coil wire of the third coil 830.

Furthermore, each of first and second connection wires of the plurality of coils may extend from each coil in the same direction of one side surface of the coil device. More specifically, each of the first and second connection wires of the plurality of coils may extend in a direction of a cable enter/exit portion 950 disposed on one side of a coil frame 900 to be disposed at a plurality of enter/exit holes 951, respectively. For example, the first-first connecting portion 811 and the first-second connecting portion 812 of the first coil 810, the second-first connecting portion 821 and the second-second connecting portion 822 of the second coil 820, and the third-first connecting portion 831 and the third-second connecting portion 832 of the third coil 830 may be disposed to extend to each of the plurality of entrance/exit holes 951 of the cable enter/exit portion 950 disposed on one side of the coil frame 900.

A coil device according to another embodiment may include a coil frame 900.

The coil frame 900 may include an upper receiving portion 920 in which a coil is disposed. The upper receiving portion 920 may be disposed on an outer upper portion 910 of the coil frame 900. The upper receiving portion 920 may be shaped like an opening, a partial opening or a recess. For example, as shown in FIG. 9, the first coil 810 may be disposed in the upper receiving portion 920 having a partial opening shape. In addition, when the upper receiving portion 920 has the partial opening shape, the upper receiving portion 920 may include one or more coil supporting portions 921 for supporting the coil in an unopened region. For example, the first coil 810 disposed at and inserted into the upper receiving portion 920 having the opening shape may be disposed to be in contact with an upper surface of the coil supporting portion 921 and supported.

In addition, the coil frame 900 may include a lower receiving portion 930. The lower receiving portion 930 may be formed by the outer upper portion 910 and an outer portion 912 of the coil frame 900. The lower receiving portion 920 may house one or more coils, a shielding material 1000, a heat dissipating member 1100, or a male connector 1200. For example, as shown in FIG. 9, in the lower receiving portion 930, the second coil 820 and the third coil 830 may be disposed on the same layer, the shielding material 1000 may be disposed on a lower layer of the second coil 820 and the third coil 830, and the heat dissipating member 1100 and the male connector 1200 may be disposed on a lower layer of the shielding material 1000.

Further, the coil frame 900 may include a coil frame fixing portion 940. The coil frame fixing portion 940 may be in plural. The coil frame fixing portion 940 may be disposed at each corner of the coil frame 900. The coil frame fixing portion 940 may include a coil frame fixing hole 941 such that the coil frame fixing portion 940 may be fixed to a coil mount of a wireless power transmitting apparatus in which the coil is disposed. That is, screws, bolts and nuts, fixing bars, or the like may be inserted into the coil frame fixing hole 941 in order to mount or install the coil device on the coil mount.

Furthermore, the coil frame 900 may include a cable enter/exit portion 950. The cable enter/exit portion 950 may be formed on one side of the outer portion 912 of the coil frame 900. The cable enter/exit portion 950 may include a plurality of enter/exit holes 951. The plurality of enter/exit holes 951 are disposed corresponding to the connecting portions of the plurality of coils, respectively, and may be a passage through which the connecting portions of the plurality of coils pass to be connected to the connection pins 1220 of the male connector 1200.

A coil device according to another embodiment may include a shielding material 1000. The shielding material 1000 may be disposed in the lower receiving portion 930 of the coil frame 900. The shielding material 1000 may be disposed on a lower surface of the plurality of coils. The shielding material 1000 may guide the wireless power generated by the plurality of coils disposed in the upper portion thereof in a charging direction, and may protect various circuits disposed in the lower portion of the coil device from an electromagnetic field.

A coil device according to another embodiment may include a heat dissipating member 1100. The heat dissipating member 1100 may be disposed in the lower receiving portion 930 of the coil frame 900. The heat dissipating member 1100 may be disposed on a lower surface of the shielding material 1000. When heat generated from a plurality of coils is transferred through the shielding material 1000, the heat dissipating member 1100 may release the heat to the outside of the coil device. The heat dissipating member 1100 may be made of a material having high thermal conductivity or thermal emissivity. More specifically, the heat dissipating member 1100 may be any one of an aluminum (Al) sheet, a copper (Cu) sheet, and a copper (Cu) tape. As an example, when the heat dissipating member 1100 is an aluminum (Al) sheet, the heat dissipating member 1100 may have a thickness of 0.9 mm or more to 1.1 mm or less. As another example, as shown in FIG. 11, the heat dissipating member 1100 may be a copper (Cu) sheet. The heat dissipating member 1100 of the copper (Cu) sheet may have a thickness of 0.4 mm or more to 0.6 mm or less. That is, since the thickness of the heat dissipating member 1100 of the copper (Cu) sheet is thinner than that of the heat dissipating member 1100 of the aluminum (Al) sheet, the coil device may be further miniaturized. As still another example, the heat dissipating member 1100 may be a copper (Cu) tape. The heat dissipating member 1100 of the copper (Cu) tape may have a thickness of 0.09 mm or more to 0.11 mm or less. That is, the thickness of the heat dissipating member 1100 of the copper (Cu) tape may be thinner than that of the heat dissipating member 1100 of the copper (Cu) sheet. However, heat dissipation efficiency of the heat dissipating member 1100 of the copper (Cu) tape may be lower than that of the heat dissipating member 1100 of the copper (Cu) sheet. In addition, the heat dissipating member 1100 may have the same size as the shielding material 1000. Further, the heat dissipating member 1100 may have a shape corresponding to a shape of the shielding material 1000. For example, FIG. 11 shows a state in which the heat dissipating member 1100 of the copper (Cu) sheet is disposed on the shielding material. The heat dissipating member 1100 of the copper (Cu) sheet may be disposed in the same shape as the shape of the shielding material. Accordingly, the heat dissipating member 1100 may efficiently release heat transferred to the shielding material 1000 from the plurality of coils.

A coil device according to another embodiment may include a male connector 1200. The male connector 1200 may include a substrate 1210 and a plurality of connection pins 1220. The substrate 1210 may be disposed in the lower receiving portion 930 of the coil frame 900. The substrate 1210 is disposed at a lower end of the shielding material 1000, and may be disposed on the same layer as the heat dissipating member 1100. Further, the substrate 1210 may be disposed corresponding to the cable enter/exit portion 950 of the coil frame 900. The substrate 1210 may be rigid. The rigid substrate 1210 may support the connection pins 1220 when the connection pins 1220 are connected to an external device. The plurality of connection pins 1220 may be disposed pass through the substrate 1210. The plurality of connection pins 1220 may be disposed corresponding to the plurality of enter/exit holes 951 of the cable enter/exit portion 950 of the coil frame 900. Each one side of the plurality of connection pins 1220 may be electrically connected to the connecting portions of the plurality of coils, and each other side thereof may be exposed to a lower side of the substrate 1210.

FIG. 12 is a graph showing heat dissipation efficiency according to a kind of heat dissipating member in a coil device according to another embodiment.

Referring to FIG. 12, FIG. 12 is a graph showing a temperature change according to a charging time of the coil device. In case of a dotted line, it is a temperature change in case in which a heat dissipating member 1100 is an aluminum (Al) sheet. In case of a solid line, it is a temperature change when the heat dissipating member 1100 is a copper (Cu) sheet. Comparing the aluminum (Al) sheet and the copper (Cu) sheet, it may be seen that the copper (Cu) sheet has a lower temperature, and thus the copper (Cu) sheet has a higher heat release efficiency. Therefore, a thickness of the copper (Cu) sheet is thinner than that of the aluminum (Al) sheet and has higher heat improvement efficiency.

Therefore, another embodiment may provide a coil device capable of efficiently improving heat and a wireless power transmitting/receiving apparatus including the coil device. In addition, in another embodiment, the heat of the coil device may be improved by using a thin heat dissipating member. Further, another embodiment may provide a coil device that are improved in heat and increase wireless power charging efficiency and a wireless power transmission/reception device including the coil device.

<Coil Device According to Still Another Embodiment>

FIG. 13 is an exploded perspective view of a coil device according to still another embodiment.

The coil device according to another embodiment may be at least one of a transmission coil of a wireless power transmitting apparatus and a reception coil of a wireless power receiving apparatus. In addition, the coil device is not limited to the wireless power transmitting apparatus, and may be applied to an apparatus using a coil that wirelessly transmits an induced electromotive force.

Referring to FIG. 13, a coil device according to still another embodiment may include a plurality of coils.

The plurality of coils may be a plurality of transmission coils of a wireless power transmitting apparatus, or a plurality of reception coils of a wireless power receiving apparatus. In addition, the plurality of coils may be wound in the same number of turns, but are not limited thereto, and may be wound a different number of turns. Further, the plurality of coils may have the same inductance, but are not limited thereto, and may have different inductances. Furthermore, the plurality of coils may be disposed one or more layers. More specifically, the plurality of coils may include a first coil 810 to a third coil 830. The second coil 820 and the third coil 830 may be disposed on a first layer disposed on the same layer. The first coil 810 may be disposed on a second layer disposed on upper portions of the second coil 820 and the third coil 830. Therefore, the coil device according to another embodiment may extend a charging area such that the plurality of coils may be disposed in different layers to efficiently transmit wireless power.

In addition, the plurality of coils may include first and second connecting portions to or from which an AC signal is input or output, respectively. The first and second connecting portions may be wires or cables coated with sheath. The first and second connecting portions may be connected to connection pins 1220 of a male connector 1200 by a soldering process. More specifically, the first coil 810 may include a first-first connecting portion 811 and a first-second connecting portion 812. The first-first connecting portion 811 may extend from a coil wire disposed outside the first coil 810. The first-second connecting portion 812 may extend from a coil wire disposed inside the first coil 810. The present embodiment is not limited thereto, and the first-first connecting portion 811 may extend from an inner coil wire of the first coil 810, and the first-second connecting portion 812 may extend from an outer coil wire of the first coil 810. The second coil 820 may include a second-first connecting portion 821 and a second-second connecting portion 822. The second-first connecting portion 821 may extend from a coil wire disposed outside the second coil 820. The second-second connecting portion 822 may extend from a coil wire disposed inside the second coil 820. The present embodiment is not limited thereto, and the second-first connecting portion 821 may extend from an inner coil wire of the second coil 820, and the second-second connecting portion 822 may extend from an outer coil wire of the second coil 820. The third coil 830 may include a third-first connecting portion 831 and a third-second connecting portion 832. The third-first connecting portion 831 may extend from a coil wire disposed inside the third coil 830. The third-second connecting portion 832 may extend from a coil wire disposed outside the third coil 830. The present embodiment is not limited thereto, and the third-first connecting portion 831 may extend from an outer coil wire of the third coil 830, and the third-second connecting portion 832 may extend from an inner coil wire of the third coil 830.

Further, each of first and second connection wires of the plurality of coils may extend from each coil in the same direction of one side surface of the coil device. More specifically, each of the first and second connection wires of the plurality of coils may extend in a direction of a cable enter/exit portion 1950 disposed on one side of a coil frame 1900 to be disposed at a plurality of enter/exit holes 1951, respectively. For example, the first-first connecting portion 811 and the first-second connecting portion 812 of the first coil 810, the second-first connecting portion 821 and the second-second connecting portion 822 of the second coil 820, and the third-first connecting portion 831 and the third-second connecting portion 832 of the third coil 830 may be disposed to extend to each of the plurality of entrance/exit holes 1951 of the cable enter/exit portion 1950 disposed on one side of the coil frame 1900.

A coil device according to another embodiment may include a coil frame 1900.

The coil frame 1900 may include a first region 1911 and a second region 1913. The first region 1911 is a partial region of an outer upper portion 1910, and may be a region corresponding to a plurality of coils. The first region 1911 may be made of a material through which magnetic field signals of the plurality of coils disposed in a lower receiving portion 1930 may pass. For example, the material of the first region 1911 may be PET. The second region 1913 may be a partial region of the outer upper portion 1910 excluding the first region 1911 and an outer portion 1912. The second region 1913 may be in contact with a shielding material 1000 disposed in the lower receiving portion 1930. When heat generated in a plurality of coils 810 to 830 is transferred to the shielding material 1000, the second region 1913 may release the heat of the shielding material 1000 to the outside of the coil device. That is, the second region 1913 may not only support the coil device but also release heat to improve heat of the coil device. More specifically, the second region 1913 may be made of a material having high thermal conductivity or thermal emissivity. For example, the second region 1913 may be made of a metal material such as aluminum (Al), copper (Cu), etc., or a material having high thermal conductivity. That is, the first region 1911 and the second region 1913 may be made of different materials. The first region 1911 and the second region 1913 may be formed integrally. For example, the first region 1911 and the second region 1913 may be manufactured by an injection molding process.

In addition, the coil frame 1900 may include a plurality of extension wing portions 1960. The extension wing portion 1960 may be formed to extend in a lower direction at a lower end of the outer portion 1912. Further, the extension wing portion 1960 may be made of the same material as the outer portion 1912. For example, the extension wing portion 1960 may be made of a metal material such as aluminum (Al), copper (Cu), etc., or a material having high thermal conductivity. The extension wing portion 1960 may be formed integrally with the outer portion 1912. More specifically, the plurality of extension wing portions 1960 may include first to third extension wing portions 1961 to 1963. The first extension wing portion 1961 and the second extension wing portion 1962 may be disposed facing each other at a different location on the outer portion 1912 of the coil frame 1900, respectively. The third extension wing portion 1963 may be disposed on the outer portion 1912 opposite the cable enter/exit 1950. That is, the third extension wing portion 1963 may be disposed on the first and second extension wing portions 1961 and 1962, and the outer portion 1912 in which the cable enter/exit portion 1950 is not disposed. Furthermore, the extension wing portion 1960 may release heat transferred to the outer portion 1912 to the outside of the coil device. More specifically, the extension wing portion 1960 may transfer heat transferred to the outer portion 1912 from the shielding material 600 to an external device or a coil mount to improve heat of the coil device. In addition, the extension wing portion 1960 may be connected to a ground of the coil mount to become a ground of the coil device. Further, the extension wing portion 1960 may couple to the coil mount to firmly fix the coil device. Furthermore, the extension wing portion 1960 may have the same thickness as the outer portion 1912. The present embodiment is not limited thereto, and the extension wing portion 1960 may decrease in thickness as it goes away from the outer portion 1912. In addition, a shape of the extension wing portion 1960 may be a square, a triangle, a semicircle, an ellipse, a trapezoid, or the like. For example, as shown in FIG. 13, the extension wing portion 1960 may have a rectangular shape. Further, the plurality of extension wing portions 1961 to 1963 may have the same shape. The present embodiment is not limited thereto, and the shape of the plurality of extension wing portions 1961 to 1963 may be different from each other. Furthermore, the plurality of extension wing portions 1960 may have the same size, and may be formed in different sizes according to the disposed positions.

Further, the coil frame 1900 may include an upper receiving portion 1920 in which a coil is disposed. The upper receiving portion 1920 may be disposed on an outer upper portion 1910 of the coil frame 1900. The upper receiving portion 1920 may be shaped like an opening, a partial opening or a recess. For example, as shown in FIG. 8, the first coil 810 may be disposed in the upper receiving portion 1920 having a partial opening shape. In addition, when the upper receiving portion 1920 has the partial opening shape, the upper receiving portion 1920 may include one or more coil supporting portions 1921 for supporting the coil in an unopened region. For example, the first coil 810 disposed at and inserted into the upper receiving portion 1920 having the opening shape may be disposed to be in contact with an upper surface of the coil supporting portion 1921 and supported.

Furthermore, the coil frame 1900 may include a lower receiving portion 1930. The lower receiving portion 1930 may be formed by the outer upper portion 1910 and an outer portion 1912 of the coil frame 1900. The lower receiving portion 1920 may house one or more coils, a shielding material 1000, or a male connector 800. For example, as shown in FIG. 13, in the lower receiving portion 1930, the second coil 820 and the third coil 830 may be disposed on the same layer, the shielding material 1000 may be disposed on a lower layer of the second coil 820 and the third coil 830, and the male connector 1200 may be disposed on a lower layer of the shielding material 1000.

In addition, the coil frame 1900 may include a coil frame fixing portion 1940. The coil frame fixing portion 1940 may be in plural. The coil frame fixing portion 1940 may be disposed at each corner of the coil frame 1900. The coil frame fixing portion 1940 may be formed of the same material as the second region 1913 and the outer portion 1912. The coil frame fixing portion 1940 may be integrally formed with the second region 1913 and the outer portion 1912. Further, the coil frame fixing portion 1940 may include a coil frame fixing hole 1941 such that the coil frame fixing portion 1940 may be fixed to a coil mount of a wireless power transmitting apparatus in which the coil is disposed. That is, screws, bolts and nuts, fixing bars, or the like may be inserted into the coil frame fixing hole 1941 in order to mount or install the coil device on the coil mount.

Further, the coil frame 1900 may include a cable enter/exit portion 1950. The cable enter/exit portion 1950 may be formed on one side of the outer portion 1912 of the coil frame 1900. The cable enter/exit portion 1950 may include a plurality of enter/exit holes 1951. The plurality of enter/exit holes 1951 are disposed corresponding to the connecting portions of the plurality of coils, respectively, and may be a passage through which the connecting portions of the plurality of coils pass to be connected to the connection pins 1220 of the male connector 1200.

A coil device according to another embodiment may include a shielding material 1000. The shielding material 1000 may be disposed in the lower receiving portion 1930 of the coil frame 1900. The shielding material 1000 may be disposed on a lower surface of the plurality of coils. The shielding material 1000 may guide the wireless power generated by the plurality of coils disposed in the upper portion thereof in a charging direction, and may protect various circuits disposed in the lower portion of the coil device from an electromagnetic field.

A coil device according to another embodiment may include a male connector 1200. The male connector 1200 may include a substrate 1210 and a plurality of connection pins 1220. The substrate 1210 may be disposed in the lower receiving portion 1930 of the coil frame 1900. The substrate 1210 is disposed at a lower end of the shielding material 1000. Further, the substrate 1210 may be disposed corresponding to the cable enter/exit portion 1950 of the coil frame 1900. The substrate 1210 may be rigid. The rigid substrate 1210 may support the connection pins 1220 when the connection pins 1220 are connected to an external device. The plurality of connection pins 1220 may be disposed pass through the substrate 1210. The plurality of connection pins 1220 may be disposed corresponding to the plurality of enter/exit holes 1951 of the cable enter/exit portion 1950 of the coil frame 1900. Each one side of the plurality of connection pins 1220 may be electrically connected to the connecting portions of the plurality of coils, and each other side thereof may be exposed to a lower side of the substrate 1210.

Therefore, another embodiment may provide a coil device capable of efficiently improving heat and a wireless power transmitting/receiving apparatus including the coil device. In addition, in another embodiment, the heat of the coil device may be improved by using a coil frame having a simple structure. Further, another embodiment may provide a coil device with improved durability and a wireless power transmitting/receiving apparatus including the coil device. Furthermore, another embodiment may provide a coil device that are improved in heat and increase wireless power charging efficiency and a wireless power transmission/reception device including the coil device.

FIG. 14 is a perspective view for describing a coil mount in which a coil device according to still another embodiment is installed, and FIG. 15 is a view for describing a state in which the coil device of FIG. 13 is disposed on the mount of FIG. 14.

Referring to FIG. 14, a coil mount 2000 may be a configuration included in the coil device. The present embodiment is not limited thereto, and the coil mount 2000 may be an external configuration of a coil device. The coil mount 2000 may be a configuration in which a coil device is mounted or installed. The coil mount 2000 may include a plurality of extension wing coupling portions 2011 to 2013 or a female connector 2020.

The coil mount 2000 may be a rigid substrate. For example, the coil mount 2000 may be a PCB. The thickness of the plurality of extension wing coupling portions 2011 to 2013 may be larger than that of the extension wing portion 1560. In addition, the plurality of extension wing coupling portions 2011 to 2013 may have a slit-shape. Further, the plurality of extension wing coupling portions 2011 to 2013 may be a groove, a hole or a recess. Furthermore, the plurality of extension wing coupling portions 2011 to 2013 may be disposed corresponding to the plurality of extension wing portions 1960 of the coil frame 1900 of FIG. 13. The plurality of extension wing coupling portions 2011 to 2013 may be coupled by inserting the plurality of extension wing portions 1961 to 1963. In addition, the plurality of extension wing coupling portions 2011 to 2013 may be connected to the ground. Further, the plurality of extension wing coupling portions 2011 to 2013 may cool heat transferred from the plurality of extension wing portions 1960.

The female connector 2020 may be disposed corresponding to the male connector 1200 of FIG. 13. In addition, the female connector 2020 may include connection grooves corresponding to the plurality of connection pins 1220 of the male connector 1200.

Referring to FIG. 15, FIG. 15 shows a state in which a coil device according to still another embodiment is installed on a coil mount 2000.

More specifically, a first extension wing portion 1961 is inserted and coupled to a first extension wing coupling portion 2011. A second extension wing portion 1962 is inserted and coupled to a second extension wing coupling portion 2012. A third extension wing portion 1963 is inserted and coupled to a third extension wing coupling portion 2013.

A plurality of connection pins 1220 of a male connector 1200 are inserted and coupled to correspond to a plurality of connection grooves 2021 of the female connector 2020. Accordingly, a power supply configuration connected to the female connector 2020 may be connected to the male connector 1200.

The coil device may be integrated with the coil mount 2000 by inserting a fixing screw into a fixing hole 1941 of a coil frame fixing portion 1940.

<Coil Device According to Still Another Embodiment>

FIG. 16 is a plan view of a lower portion of a coil device according to still another embodiment.

The coil device according to still another embodiment may be at least one of a transmission coil of a wireless power transmitting apparatus and a reception coil of a wireless power receiving apparatus. In addition, the coil device is not limited to the wireless power transmitting apparatus, and may be applied to an apparatus using a coil that wirelessly transmits an induced electromotive force.

Still another embodiment of FIG. 16 has the same configuration except for an extension wing portion 1960 of another embodiment of FIG. 13. Hereinafter, a configuration that is different from another embodiment of FIG. 13 will be described.

Referring to FIG. 16, the extension wing portion 1970 may be made of the same material as the outer portion 1912. For example, the extension wing portion 1970 may be made of a metal material such as aluminum (Al), copper (Cu), etc., or a material having high thermal conductivity. The extension wing portion 1970 may be formed integrally with the outer portion 1912. More specifically, the plurality of extension wing portions 1970 may include first to third extension wing portions 1971 to 1973. The first extension wing portion 1971 and the second extension wing portion 1972 may be disposed facing each other at a different location on the outer portion 1912 of the coil frame, respectively. The third extension wing portion 1973 may be disposed on the outer portion 1912 opposite the outer portion 1912 in which a male connector 1200 is disposed. That is, the third extension wing portion 1973 may be disposed on the first and second extension wing portions 1971 and 1972, and the outer portion 1912 in which the male connector 1200 is not disposed.

The extension wing portion 1970 may be disposed at a lower end of a shielding material 1000. More specifically, the extension wing portion 1970 may be in contact with the lower end of the shielding material 1000 to support the shielding material 1000. Accordingly, the extension wing portion 1970 may receive heat of the shielding material 1000 and release the heat. In addition, the extension wing portion 1970 may prevent the plurality of coils and the shielding material 1000 which are components in an upper receiving portion of the coil frame from being separated. That is, durability of the coil device may be increased by the extension wing portion 1970. For example, as shown in FIG. 11, the first extension wing portion 1971 may extend inward the shielding material 1000 from a lower end of one outer portion 512 to support one region of the shielding material 1000. The second extension wing portion 1972 may extend inward the shielding material 1000 from a lower end of another outer portion 512 to support another region of the shielding material 1000. The third extension wing portion 1973 may extend inward the shielding material 1000 from a lower end of still another outer portion 1912 to support still another region of the shielding material 1000. Further, the extension wing portion 1970 may be connected to a ground of the coil mount to become a ground of the coil device. Furthermore, the extension wing portion 1960 may have the same thickness as the outer portion 1912. The present embodiment is not limited thereto, and the thickness of the extension wing portion 1960 may be thinner than that of the outer portion 1912. In addition, a shape of the extension wing portion 1970 may be a square, a triangle, a semicircle, an ellipse, a trapezoid, or the like. For example, as shown in FIG. 11, the extension wing portion 1960 may have a rectangular shape. Further, the plurality of extension wing portions 1971 to 1973 may have the same shape. The present embodiment is not limited thereto, and the shape of the plurality of extension wing portions 1971 to 1973 may be different from each other. Furthermore, the plurality of extension wing portions 1970 may have the same size, and may be formed in different sizes according to the disposed positions.

FIG. 17 is a perspective view for describing a coil mount on which the coil device of FIG. 16 is installed, and FIG. 18 is a view for describing a state in which the coil device of FIG. 16 is disposed on the mount of FIG. 17.

Referring to FIG. 17, a coil mount 3000 may be a configuration included in a coil device according to still another embodiment of FIG. 16. The present embodiment is not limited thereto, and the coil mount 3000 may be an external configuration of the coil device according to still another embodiment. The coil mount 3000 may be a configuration in which a coil device is mounted or installed. The coil mount 3000 may include a plurality of extension wing terminal portions 3011 to 3013 or a female connector 3020.

The coil mount 3000 may be a rigid substrate. For example, the coil mount 3000 may be a PCB. The plurality of extension wing terminal portions 3011 to 3013 may be disposed corresponding to a plurality of extension wing portions 1570 of the coil frame of FIG. 11. The plurality of extension wing terminal portions 3011 to 3013 may be disposed in contact with the plurality of extension wing portions 1571 to 1573. In addition, the plurality of extension wing terminal portions 3011 to 3013 may have shapes corresponding to the plurality of extension wing portions 1971 to 1973 for efficient heat transfer or signal transmission. Further, the plurality of extension wing terminal portions 3011 to 3013 may be connected to the ground. Furthermore, the plurality of extension wing terminal portions 3011 to 3013 may cool heat transferred from the plurality of extension wing portions 1970.

The female connector 3020 may be disposed corresponding to the male connector 1200 of FIG. 16. In addition, the female connector 3020 may include connection grooves 3021 corresponding to the plurality of connection pins 1220 of the male connector 1200.

Referring to FIG. 18, FIG. 18 shows a state in which a coil device according to still another embodiment is installed on a coil mount 3000.

More specifically, a first extension wing portion 1971 is disposed in contact with a first extension wing terminal portion 3011. A second extension wing portion 1972 is disposed in contact with a second extension wing terminal portion 3012. A third extension wing portion 1973 is disposed in contact with a third extension wing terminal portion 3013.

A plurality of connection pins 820 of a male connector 800 are inserted and coupled to correspond to a plurality of connection grooves 3021 of the female connector 3020. Accordingly, a power supply configuration connected to the female connector 3020 may be connected to the male connector 800.

The coil device may be integrated with the coil mount 3000 by inserting a fixing screw into a fixing hole 1941 of a coil frame fixing portion 1940.

Therefore, still another embodiment may provide a coil device capable of efficiently improving heat and a wireless power transmitting/receiving apparatus including the coil device. In addition, in still another embodiment, the heat of the coil device may be improved by using a coil frame having a simple structure. Further, still another embodiment may provide a coil device with improved durability and a wireless power transmitting/receiving apparatus including the coil device. Furthermore, still another embodiment may provide a coil device that are improved in heat and increase wireless power charging efficiency and a wireless power transmission/reception device including the coil device.

<Coil Device According to Still Another Embodiment>

FIG. 19 is an exploded perspective view of a coil device according to still another embodiment.

The coil device according to another embodiment may be at least one of a transmission coil of the wireless power transmitting apparatus and a reception coil of a wireless power receiving apparatus. In addition, the coil device is not limited to the wireless power transmitting apparatus, and may be applied to an apparatus using a coil that wirelessly transmits an induced electromotive force.

Still another embodiment of FIG. 19 has the same configuration except for a heat dissipating member added in another embodiment of FIG. 13. Hereinafter, a configuration that is different from that of another embodiment of FIG. 13 will be described.

Referring to FIG. 19, a coil device according to still another embodiment may include a heat dissipating member 1100. The heat dissipating member 1100 may be disposed in a lower receiving portion 1930 of a coil frame 1900. The heat dissipating member 1100 may be disposed on a lower surface of a shielding material 1000. When heat generated from a plurality of coils is transferred through the shielding material 1000, the heat dissipating member 1100 may release the heat to the outside of the coil device. The heat dissipating member 1100 may be made of a material having high thermal conductivity or thermal emissivity. More specifically, the heat dissipating member 1100 may be any one of an aluminum (Al) sheet, a copper (Cu) sheet, and a copper (Cu) tape. As an example, when the heat dissipating member 1100 is an aluminum (Al) sheet, the heat dissipating member 1100 may have a thickness of 0.9 mm or more to 1.1 mm or less. As another example, the heat dissipating member 1100 may be a copper (Cu) sheet. The heat dissipating member 1100 of the copper (Cu) sheet may have a thickness of 0.4 mm or more to 0.6 mm or less. That is, since the thickness of the heat dissipating member 1100 of the copper (Cu) sheet is thinner than that of the heat dissipating member 1100 of the aluminum (Al) sheet, the coil device may be further miniaturized. As still another example, the heat dissipating member 1100 may be a copper (Cu) tape. The heat dissipating member 1100 of the copper (Cu) tape may have a thickness of 0.09 mm or more to 0.11 mm or less. That is, the thickness of the heat dissipating member 1100 of the copper (Cu) tape may be thinner than that of the heat dissipating member 1100 of the copper (Cu) sheet. However, heat dissipation efficiency of the heat dissipating member 1100 of the copper (Cu) tape may be lower than that of the heat dissipating member 700 of the copper (Cu) sheet. In addition, the heat dissipating member 1100 may have the same size as that of the shielding material 1100. Further, the heat dissipating member 1100 may have a shape corresponding to a shape of the shielding material 1000. For example, the heat dissipating member 1100 of the copper (Cu) sheet may be disposed on the shielding material. The heat dissipating member 1100 of the copper (Cu) sheet may be disposed in the same shape as the shape of the shielding material. Accordingly, the heat dissipating member 1100 may efficiently release heat transferred to the shielding material 1000 from the plurality of coils.

Therefore, still another embodiment may provide a coil device capable of efficiently improving heat and a wireless power transmitting/receiving apparatus including the coil device. In addition, in still another embodiment, the heat of the coil device may be improved by using a thin heat dissipating member. Further, in still another embodiment, the heat of the coil device may be improved by using a coil frame having a simple structure. Furthermore, still another embodiment may provide a coil device with improved durability and a wireless power transmitting/receiving apparatus including the coil device. Furthermore, still another embodiment may provide a coil device that is improved in heat and increases wireless power charging efficiency and a wireless power transmitting/receiving apparatus including the coil device.

It will be understood by those skilled in the art that other changes may be made therein without departing the spirit and features of the present invention.

Therefore, the foregoing detailed descriptions are not restrictively construed in all aspects but have to be considered as illustrative purposes. The scope of the embodiment has to be determined by rational interpretation of appended claims, and all changes within the equivalent scope of the embodiment belong to the scope embodiment.

The invention claimed is:

1. A coil device comprising:
   a first coil including a first connecting portion, a second coil including a second connecting portion, and a third coil including a third connecting portion; and
   a coil frame including a first receiving portion for housing the first coil, a second receiving portion for housing the second and third coils, and a cable fixing portion for fixing the first to third connecting portions, wherein the cable fixing portion includes a plurality of guide portions, and wherein the plurality of guide portions include a plurality of protrusion portions that separate the first and third connecting portions and guide the first to third connecting portions to be disposed extending in a downward direction.

2. The coil device of claim 1, wherein at least one of the plurality of guide portions includes:

a first protrusion portion protruding in a first direction and to guide one of the first to third connecting portions to be fixed; and a second protrusion portion protruding in a second direction and to guide one of the first to third connecting portions to disposed extending in the downward direction.

3. The coil device of claim 2, wherein the cable fixing portion further includes a cable supporting portion corresponding to the first protrusion portion, and fixes at least one of the first to third connecting portions by the cable supporting portion and the first protrusion portion.

4. The coil device of claim 1, wherein the cable fixing portion protrudes from an outer portion of the coil frame.

5. The coil device of claim 1, wherein the coil frame further includes a coil frame fixing portion at corners thereof, and wherein an outer side of the guide portion is protruded by a distance equal to or smaller than a coil frame fixing portion protruding from an outer portion of the coil frame.

6. The coil device of claim 1, wherein the cable fixing portion is spaced apart from the first receiving portion.

7. The coil device of claim 1, further comprising:

a shielding material disposed at lower sides of the second coil and the third coil and housed in the second receiving portion; and a heat dissipating sheet disposed at a lower side of the shielding material and housed in the second receiving portion.

8. The coil device of claim 3, wherein the cable supporting portion is disposed in parallel with a protruding direction of the first protrusion portion.

9. The coil device of claim 1, wherein the guide portion has a guide length from an outer side end thereof to an inner side end thereof, and the inner side end is spaced apart from the first receiving portion by a predetermined distance.

10. A coil device comprising:

first to third coils including a connecting portion; and a coil frame including a receiving portion for housing the first to third coils and a cable fixing portion for fixing the connecting portion, wherein the cable fixing portion includes:

a first protrusion portion protruding in a first direction; and a second protrusion portion protruding in a second direction, wherein the first protrusion portion guides any one of the connecting portions of the first to third coils to be fixed, and wherein the second protrusion portion guides any one of the connecting portions of the first to third coils to be disposed extending in a downward direction.

11. The coil device of claim 10, wherein the cable fixing portion protrudes from an outer portion of the coil frame.

12. The coil device of claim 10, wherein the coil frame further includes a coil frame fixing portion at corners thereof, and wherein an outer side of the guide portion is protruded by a distance equal to or smaller than a coil frame fixing portion protruding from an outer portion of the coil frame.

13. The coil device of claim 11, wherein the coil frame further includes a coil frame fixing portion at corners thereof, and wherein an outer side of the guide portion is protruded by a distance equal to or smaller than a coil frame fixing portion protruding from an outer portion of the coil frame.

14. A coil device comprising:

first to third coils, each of the first to third coils including a connecting portion; and a coil frame including a first receiving portion for housing the first coil, a second receiving portion for housing the second and third coils, and a cable fixing portion for fixing the connecting portion of each of the first to third coils, wherein the coil frame further includes a coil frame fixing portion disposed at a corner of the coil frame wherein the cable fixing portion includes a guide portion for guiding the connection portion of at least one of the first to third coils, the guide portion extending away from an outer lateral surface of the coil frame, wherein the coil frame fixing portion protrudes from the outer lateral surface of the coil frame by a first distance, and wherein an outer side of the guide portion is protruded from the outer lateral surface of the coil frame by a second distance equal to or smaller than the first distance of the coil frame fixing portion.

15. The coil device of claim 14, wherein the guide portion of the cable fixing portion includes:

a first protrusion portion protruding in a first direction; and a second protrusion portion protruding in a second direction, wherein the first protrusion portion guides any one of the connecting portions of the first to third coils to be fixed, and wherein the second protrusion portion guides any one of the connecting portions of the first to third coils to disposed extending in a downward direction.

16. The coil device of claim 15, further comprising:

a shielding material disposed at lower sides of the second coil and the third coil and housed in the second receiving portion; and a heat dissipating sheet disposed at a lower side of the shielding material and housed in the second receiving portion.

17. The coil device of claim 2, wherein the first protrusion portion has a mesa shape, and wherein the second protrusion has a rounded shape or a curved shape.

18. The coil device of claim 1, wherein each of the plurality of guide portions has a rounded edge portion and two surfaces forming a 90 degree angle.

19. The coil device of claim 2, wherein each of the plurality of guide portions has two surfaces forming a 90 degree angle, wherein the first protrusion portion has a mesa shape or a stepped shape, wherein the second protrusion has a rounded shape or a curved shape, and wherein the first protrusion of one of the plurality of guide portions extends in a direction toward the 90 degree angle of an adjacent guide portion among the plurality of guide portions.

20. The coil device of claim 2, wherein one of the first to third connecting portions is fixed between the first protrusion of one of the plurality of guide portions and the second protrusion of an adjacent guide portion among the plurality of guide portions.

* * * * *